(12) United States Patent
Sato et al.

(10) Patent No.: US 12,095,337 B2
(45) Date of Patent: Sep. 17, 2024

(54) MOTOR CONTROL DEVICE WITH LAYOUT TO DECREASE DIFFERENCE IN CURRENT PATHS

(71) Applicant: JTEKT CORPORATION, Kariya (JP)

(72) Inventors: Yuto Sato, Nagoya (JP); Yusuke Natsume, Okazaki (JP)

(73) Assignee: JTEKT CORPORATION, Kariya (JP)

( * ) Notice: Subject to any disclaimer, the term of this patent is extended or adjusted under 35 U.S.C. 154(b) by 293 days.

(21) Appl. No.: 17/665,746

(22) Filed: Feb. 7, 2022

(65) Prior Publication Data

US 2022/0271613 A1    Aug. 25, 2022

(30) Foreign Application Priority Data

Feb. 19, 2021    (JP) ................ 2021-025403

(51) Int. Cl.
*H02K 5/22* (2006.01)
*H02K 11/33* (2016.01)
*H05K 5/00* (2006.01)

(52) U.S. Cl.
CPC ............ *H02K 5/225* (2013.01); *H02K 11/33* (2016.01); *H05K 5/0026* (2013.01); *H02K 2211/03* (2013.01)

(58) Field of Classification Search
CPC .......... H02K 5/22; H02K 5/225; H02K 11/30; H02K 11/33; H02K 2211/03; H05K 5/0026
See application file for complete search history.

(56) References Cited

U.S. PATENT DOCUMENTS

| 2010/0327709 | A1  | 12/2010 | Minato et al. |
| 2015/0216083 | A1  | 7/2015  | Kanazawa et al. |
| 2018/0177080 | A1  | 6/2018  | Kitao et al. |
| 2018/0201302 | A1* | 7/2018  | Sonoda ................ H02K 11/33 |
| 2019/0103787 | A1* | 4/2019  | Maeshima ........... B62D 5/0406 |

(Continued)

FOREIGN PATENT DOCUMENTS

| JP | 2019-068542 A | 4/2019 |
| WO | WO-2020032259 A1 * | 2/2020 |

(Continued)

OTHER PUBLICATIONS

Kanai, Machine Translation of WO2020032259, Feb. 2020 (Year: 2020).*

(Continued)

*Primary Examiner* — Eric Johnson
(74) *Attorney, Agent, or Firm* — Oliff PLC

(57) ABSTRACT

A motor control device includes a board that is provided at an end of a motor including winding groups of two systems and controls supply of electric power to the winding group independently for each system. The board includes two areas that are partitioned by a boundary line passing through the center of the motor when viewed in an axial direction of the motor. A power supply terminal connector, an inverter circuit, and a motor terminal connector are sequentially arranged along the boundary line when viewed in the axial direction of the motor. The motor terminal connector is provided such that a straight line perpendicular to a direction in which motor terminals are arranged and the boundary line form an acute angle.

9 Claims, 12 Drawing Sheets

(56) References Cited

U.S. PATENT DOCUMENTS

| | | | |
|---|---|---|---|
| 2020/0140004 A1* | 5/2020 | Matsuda | H02K 11/215 |
| 2020/0329590 A1 | 10/2020 | Richards | |
| 2020/0366168 A1 | 11/2020 | Abe et al. | |
| 2021/0291895 A1* | 9/2021 | Kim | H02K 5/225 |
| 2022/0159838 A1* | 5/2022 | Fukuda | H05K 1/115 |

FOREIGN PATENT DOCUMENTS

| | | | | |
|---|---|---|---|---|
| WO | WO-2020188934 A1 * | 9/2020 | | H05K 1/115 |
| WO | WO-2022230100 A1 * | 11/2022 | | H02K 11/30 |

OTHER PUBLICATIONS

Tomioka et al., machine translation of wo2022230100, Nov. 2022 (Year: 2022).*

Jul. 25, 2022 Search Report issued in European Patent Application No. 22156246.5.

\* cited by examiner

CIRCUMFERENTIAL DIRECTION OF CORE

MOTOR CONTROL DEVICE WITH LAYOUT TO DECREASE DIFFERENCE IN CURRENT PATHS

CROSS-REFERENCE TO RELATED APPLICATION

This application claims priority to Japanese Patent Application No. 2021-025403 filed on Feb. 19, 2021, incorporated herein by reference in its entirety.

BACKGROUND

1. Technical Field

The disclosure relates to a motor control device.

2. Description of Related Art

As described in Japanese Unexamined Patent Application Publication No. 2019-068542 (JP 2019-068542 A), there is a motor including two power supply systems. The motor includes two winding groups with three phase windings included in each winding group. A control device for the motor includes a single power supply terminal connector, a single ground terminal connector, two drive circuits, two current detection circuits, two motor current breaking circuits, and two motor terminal connectors. The power supply terminal connector is a part to which DC power is supplied from an external power supply. The ground terminal connector is a part which is connected to the ground. Each drive circuit converts the DC power supplied to the power supply terminal connector to AC power which is supplied to the winding group of the corresponding system. Each motor current breaking circuit is a circuit that interrupts supply of electric power to the winding group of the corresponding system. Each current detection circuit detects a current which is supplied from the drive circuit of the corresponding system to the motor of the corresponding system. Each motor terminal connector individually supplies the AC power which is generated by the drive circuit of the corresponding system to the winding group of the corresponding system.

The control device includes a board. The board is partitioned into a first area and a second area. The power supply terminal connector, the first drive circuit, the first current detection circuit, the first motor current breaking circuit, and the first motor terminal connector are provided in the first area. The power supply terminal connector, the first drive circuit, the first current detection circuit, the first motor current breaking circuit, and the first motor terminal connector are arranged along a boundary line between the first area and the second area. The ground terminal connector, the second drive circuit, the second current detection circuit, the second motor current breaking circuit, and the second motor terminal connector are provided in the second area. The ground terminal connector, the second drive circuit, the second current detection circuit, the second motor current breaking circuit, and the second motor terminal connector are also arranged along the boundary line between the first area and the second area. The connectors and the circuits of the systems are provided to form pairs with the boundary line interposed therebetween.

SUMMARY

In the control device described in JP 2019-068542 A, a difference in length between current paths from the drive circuit in each system to the motor terminal connectors of the phases may be decreased to a certain extent by arranging the drive circuits, the current detection circuits, and the motor current breaking circuits of the systems in the board with regularity.

However, in the control device described in JP 2019-068542 A, there is following concern. That is, in the drive circuit of each system, three legs corresponding to three phases are connected in parallel. Each leg includes two switching elements which are connected in series. The three legs are arranged in a direction perpendicular to the boundary line between the first area and the second area. The three legs are divisionally supplied with DC power which is supplied to the power supply terminal connector. Accordingly, there may be a difference in length between current paths of three phases which branch at a power supply branching point for the phase legs depending on a positional relationship between the drive circuit and the power supply terminal connector.

For example, in a positional relationship between the power supply terminal connector provided in the first area of the board and the second drive circuit provided in the second area in the board, bending current paths from the power supply terminal connector to the phase legs from a direction perpendicular to the boundary line between the first area and the second area to a direction parallel to the boundary line is conceivable. In this case, the current paths from the power supply terminal connector to the phase legs are divided into a first current path closest to the power supply terminal connector, a second current path farthest from the power supply terminal connector, and a third current path located between the current path closest to the power supply terminal connector and the current path farthest from the power supply terminal connector in the direction perpendicular to the boundary line between the first area and the second area.

Accordingly, a difference in length is likely to occur between the current path passing through a side closer to the power supply terminal connector and the current path passing through a side farther from the power supply terminal connector in the direction perpendicular to the boundary line between the first area and the second area. Similarly, regarding the current paths from the power supply terminal connector to the phase legs of the first drive circuit, there may be a difference in length between a current path passing through a side closer to the power supply terminal connector and a current path passing through a side farther from the power supply terminal connector. As a result, in the control device described in JP 2019-068542 A, there is room for decreasing a total difference in length between current paths from the power supply terminal connector to the motor terminal connector.

A motor control device according to an aspect of the present disclosure includes a board that is provided at an end of a motor including winding groups of two systems and controls supply of electric power to the winding group independently for each system. The board includes two areas that are partitioned by a boundary line passing through the center of the motor when viewed in an axial direction of the motor. A power supply terminal connector that is supplied with DC power from an external DC power supply, an inverter circuit that converts the DC power supplied from the power supply terminal connector to AC power of three phases, and a motor terminal connector that is a group of connection portions to which motor terminals of three phases provided in a line along a circumference of the end of the motor are connected and in which the connection portions of the three phases are disposed at the same positions as the motor terminals of the three phases and that supplies the AC power of three phases supplied from the inverter circuit to the winding group of the corresponding system are provided in each of the two areas as elements corresponding to each system. The power supply terminal connector, the inverter circuit, and the motor terminal connector are sequentially arranged along the boundary line when viewed in the axial direction of the motor. The motor terminal connector is provided such that a straight line perpendicular to a direction in which the motor terminals are arranged and the boundary line form an acute angle.

Employing the following layout as a layout of the board can be considered. For example, the power supply terminal connector and the inverter circuit of each system are arranged along the boundary line between the two areas similarly to the aforementioned configuration, and the motor terminal connector of each system is arranged such that an extending direction of the motor terminal connector is parallel to the boundary line. In this case, a current path of each of the three phases extending from the power supply terminal connector to the corresponding motor terminal via the inverter circuit needs to be greatly bent from the direction parallel to the boundary line to the direction perpendicular to the boundary line on the way. Accordingly, a difference in length is likely to be caused among the current paths from the power supply terminal connector to the motor terminals of the three phases.

In this regard, according to the aforementioned configuration, the power supply terminal connector, the inverter circuit, and the motor terminal connector of each system are arranged along the boundary line between the two areas, and the motor terminal connector of each system is inclined such that a straight line perpendicular to the direction in which the motor terminals are arranged forms an acute angle with respect to the boundary line. A degree of bending of the current path of each of the three phases extending from the power supply terminal connector to the motor terminals via the inverter circuit can be alleviated by the inclination of the motor terminal connector with respect to the boundary line. That is, the current path of each of the three phases between the power supply terminal connector and the motor terminal connector can be provided to be more linear. Accordingly, it is possible to decrease a difference in length among the current paths of the three phases between the power supply terminal connector and the motor terminals.

In the motor control device, the power supply terminal connectors, the inverter circuits, and the motor terminal connectors of the two systems provided in the two areas may be symmetric with respect to the boundary line when viewed in the axial direction of the motor.

With this configuration, the power supply terminal connectors, the inverter circuits, and the motor terminal connectors of the two systems can be more regularly arranged on the board. In the motor control device, the inverter circuit may be located inside of the motor terminal connector which is a side approaching the center of the motor with respect to the motor terminal connector when viewed in the axial direction of the motor.

This layout can be employed as the layout of the board depending on production specifications or the like. In the motor control device, the inverter circuit may be located outside of the motor terminal connector which is a side away from the center of the motor with respect to the motor terminal connector when viewed in the axial direction of the motor.

This layout can be employed as the layout of the board depending on production specifications or the like. In the motor control device, the inverter circuit may include three legs corresponding to the three phases in which a power-supply-side switching element and a ground-side switching element are connected in series, and the three legs may be arranged in an extending direction of the motor terminal connector. In this case, a current path from the power supply terminal connector to the three legs may branch into three straight current paths at a power supply branching point for the three legs.

With this configuration, since the current paths between the power supply branching point and the three legs are provided in a straight shape, it is possible to decrease a difference in length among the current paths from the power supply branching point to the three legs. In addition, it is possible to decrease a difference in length among the current paths as a total of three phases from the power supply terminal connector to the motor terminal connector.

In the motor control device, the board may employ a configuration in which the power supply terminal connector in one of the two areas is omitted. In this case, the power supply terminal connector in the other of the two areas may be connected to the power supply branching point for the three legs of the inverter circuit in the one of the two areas.

This layout can be employed as the layout of the board depending on production specifications or the like. In the motor control device, the power supply terminal connector may be provided close to the center of the board when viewed in the axial direction of the motor.

With this configuration, for example, in comparison with a case in which the power supply terminal connector is provided close to a side opposite to the motor terminal connector with respect to the inverter circuit of the board, an electrical distance between the power supply terminal connector and the inverter circuit is shortened by the closeness of the power supply terminal connector to the center of the board. Accordingly, it is possible to decrease electrical resistance between the power supply terminal connector and the inverter circuit.

In the motor control device, a filter may be provided in the current path between the power supply terminal connector and the inverter circuit in the board. With this configuration, noise which is superimposed on DC power supplied from the power supply terminal connector to the inverter circuit is removed by the filter provided on the board. A configuration in which the filter is provided outside of the board can also be considered. In comparison with a case in which this configuration is employed, an electrical distance from the power supply terminal connector to the inverter circuit via the filter is further decreased. Accordingly, it is possible to decrease electrical resistance between the power supply terminal connector and the inverter circuit.

In the motor control device, a control circuit that controls an operation of the inverter circuit may be provided as an element corresponding to each system in the two areas of the board.

With this configuration, a single board has only to be provided in the control device. For example, two boards including a power board in which components of a power system are mounted and a control board in which components of a control system are mounted do not have to be provided in the control device.

In the motor control device, each of the two areas may be partitioned into a power circuit area which is an area corresponding to the motor and a control circuit area which is an area outside the motor in a direction parallel to the boundary line when viewed in the axial direction of the motor. In this case, components of a power system including the motor terminal connector and the inverter circuit may be provided in the power circuit area, and components of a control system including the control circuit may be provided in the control circuit area.

With this configuration, the configuration of the power system can be provided at a position closer to the motor. Accordingly, the motor terminal connector and the motor terminals can be connected more simply. It is also possible to shorten and simplify the current paths between the inverter circuit and the motor terminals.

With the motor control device according to the aspect, it is possible to further decrease a difference in length among the current paths of three phases from the power supply terminal connector to the motor terminal connector.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

First Embodiment

Figure 1:
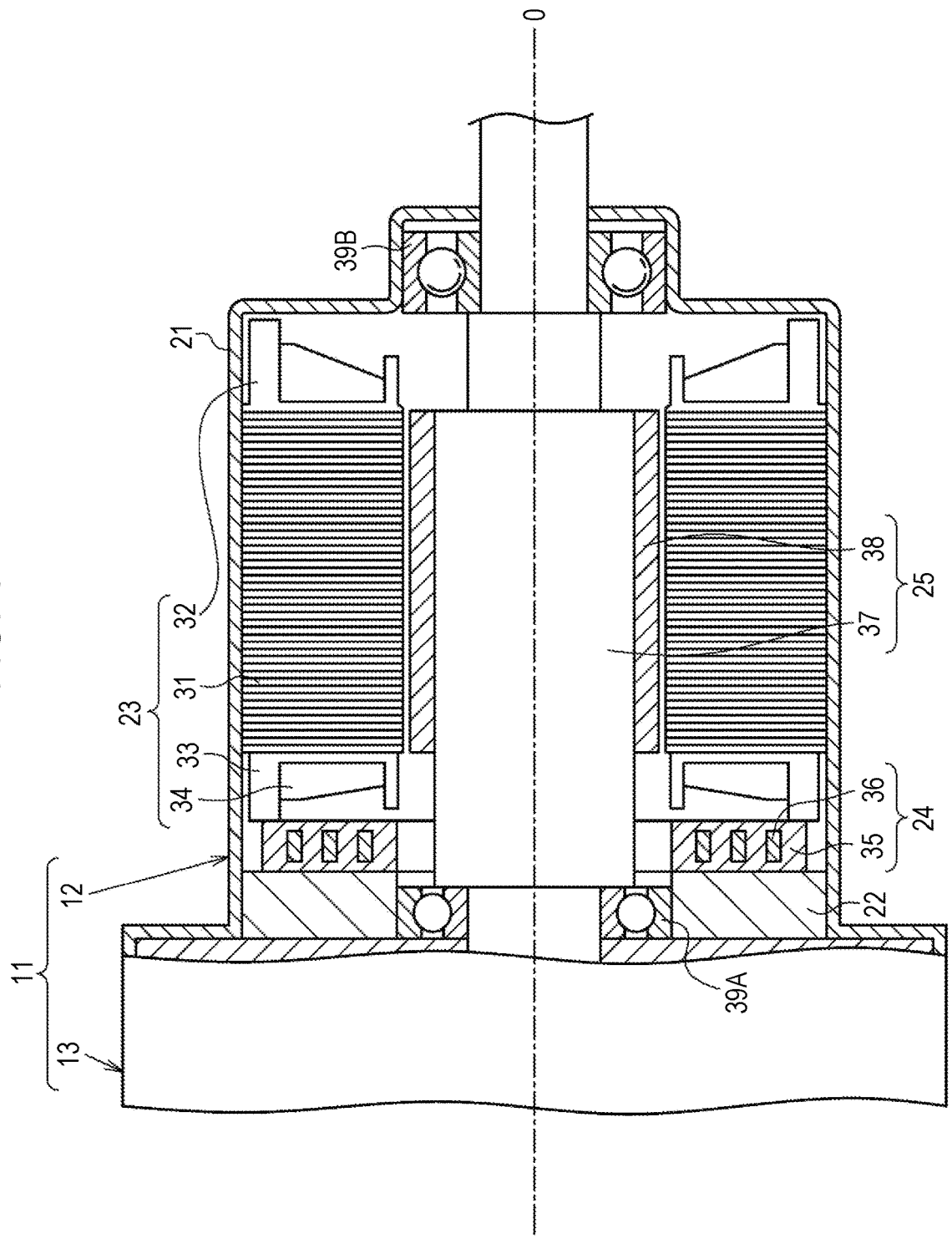
FIG. 1 is a partial sectional view of a motor system in which a motor control device according to a first embodiment is mounted.

Hereinafter, a first embodiment in which a motor control device is realized in a motor system will be described. As illustrated in FIG. 1, a motor system 11 includes a motor 12 and a control device 13. For example, a three-phase brushless motor is employed as the motor 12. The motor 12 includes winding groups of two systems. The control device 13 is provided at an end of the motor 12. The control device 13 controls supply of electric power to the winding groups of the two systems in the motor 12 independently for each system. The control device 13 corresponds to a motor control device.

The motor 12 includes a bottomed cylindrical case 21 and a lid 22 that closes an opening of the case 21. A stator 23, a bus bar module 24, and a rotor 25 are provided inside of the case 21.

The stator 23 is fixed in a state in which it is fitted to an inner circumferential surface of the case 21. The stator 23 includes a cylindrical core 31, two insulators 32 and 33, and a plurality of windings 34. The insulator 32 is provided at a first end of the core 31, and the insulator 33 is provided at a second end of the core 31. The plurality of windings 34 is wound around the core 31 with the insulators 32 and 33 interposed therebetween.

The bus bar module 24 is provided at an end of the stator 23 close to the lid 22. The bus bar module 24 includes a cylindrical holder 35 and a plurality of bus bars 36. The holder 35 is formed in a cylindrical shape out of a synthetic resin material. The bus bars 36 are held in the holder 35. Both ends of each winding 34 are appropriately connected to the corresponding bus bar 36. Each winding 34 is supplied with AC power of three phases via the corresponding bus bar 36.

The rotor 25 is inserted into the stator 23 and the bus bar module 24. The rotor 25 includes a rotation shaft 37 of a stepped columnar shape and a cylindrical rotor magnet 38 that is fixed to an outer circumferential surface of the rotation shaft 37. The rotation shaft 37 is rotatably supported by two bearings 39A and 39B provided in the inner bottom of the case 21 and the lid 22. A first end of the rotation shaft 37 penetrates the bottom of the case 21 and protrudes to the outside. A second end of the rotation shaft 37 extends toward the control device 13.

Figure 2:
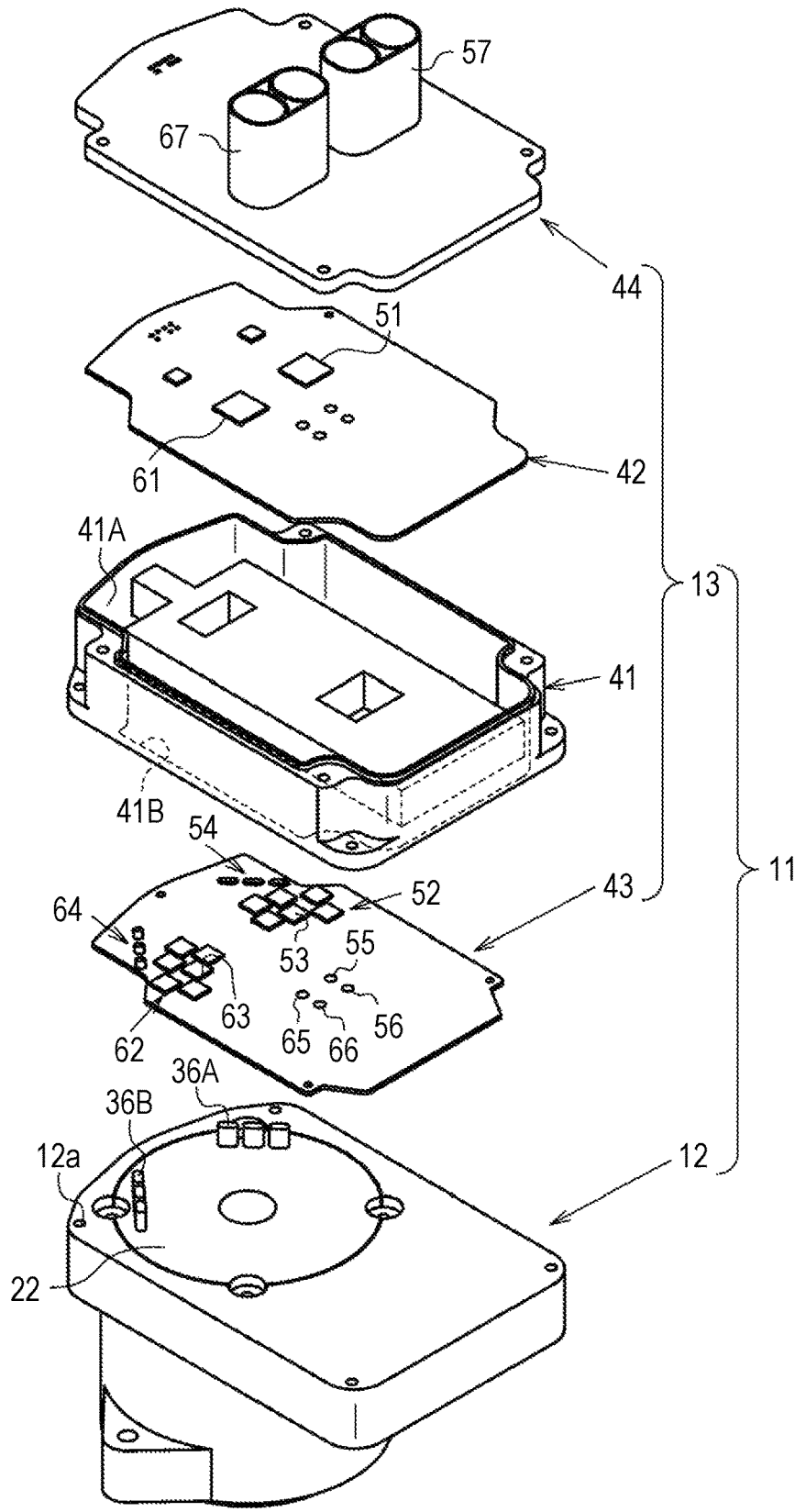
FIG. 2 is an exploded perspective view of the motor control device according to the first embodiment.

The control device 13 will be described below. As illustrated in FIG. 2, the control device 13 includes a heat sink 41, two boards 42 and 43, and a cover 44. The heat sink 41, the boards 42 and 43, and the cover 44 are assembled into a partially assembled structure. The control device 13 which is the partially assembled structure is attached to an end of the motor 12.

The heat sink 41 is fixed to the end of the motor 12. The heat sink 41 is formed of a metal material with excellent heat conductivity such as aluminum. A first board accommodating section 41A and a second board accommodating section 41B are provided in the heat sink 41. The first board accommodating section 41A is open toward a side opposite to the motor 12 (upside in FIG. 2). The second board accommodating section 41B is open toward the motor 12 side (downside in FIG. 2).

The board 42 is accommodated in the first board accommodating section 41A of the heat sink 41. Electronic components for controlling supply of electric power to the motor 12 are provided on the board 42. These electronic components include two microcomputers 51 and 61 corresponding to the winding groups of two systems and an integrated circuit (IC) group. The two microcomputers 51 and 61 are chip-like integrated circuits. The IC group takes charge of inputting and outputting an electrical signal required for control of supply of electric power to the motor 12 to and from the microcomputers 51 and 61. The electrical signal includes, for example, an electrical signal which is generated by a rotation angle sensor which will be described later. The board 42 is a so-called control board.

The board 43 is accommodated in the second board accommodating section 41B of the heat sink 41. The board 43 is fixed to an inner bottom of the second board accommodating section 41B. Electronic components for supplying electric power to the motor 12 through control by the board 42 are provided on the board 43. These electronic components include two inverter circuits 52 and 62 corresponding to the winding groups of two systems. The inverter circuit 52 includes a plurality of field effect transistors (FETs) 53, and the inverter circuit 62 includes a plurality of FETs 63. The FETs 53 and 63 are switching elements and are provided on a surface of the board 43 opposite to the motor 12. Two motor terminal connectors 54 and 64, two power supply terminal connectors 55 and 65, and two ground terminal connectors 56 and 66 corresponding to the winding groups of two systems are provided on the board 43. A rotation angle sensor (not illustrated) for detecting rotation of the motor 12 is provided on a surface of the board 43 on the motor 12 side. The board 43 is a so-called power board.

The cover 44 is attached to the surface of the heat sink 41 opposite to the motor 12 side. The cover 44 is integrally formed of a synthetic resin material. The cover 44 closes the first board accommodating section 41A of the heat sink 41 by covering it. The board 42 is fixed to an inner bottom of the cover 44.

Two connector fitting portions 57 and 67 corresponding to the winding groups of two systems are provided on a surface of the cover 44 opposite to the heat sink 41 side. Each of the connector fitting portions 57 and 67 has a rectangular tube shape and is open to the side opposite to the heat sink 41. A plug connector that is provided at a second end of a cable of which a first end is connected to a DC power source such as a battery is fitted to each of the two connector fitting portions 57 and 67.

A power supply terminal and a ground terminal which are not illustrated are provided in each of the two connector fitting portions 57 and 67. The power supply terminal of the connector fitting portion 57 penetrates the board 42 and the heat sink 41 in a noncontact manner and is connected to a power supply terminal connector 55 of the board 43. The ground terminal of the connector fitting portion 57 penetrates the board 42 and the heat sink 41 in a noncontact manner and is connected to a ground terminal connector 56 of the board 43. Similarly, the power supply terminal of the connector fitting portion 67 is connected to a power supply terminal connector 65. The ground terminal of the connector fitting portion 67 is connected to a ground terminal connector 66.

The board 43 is supplied with the DC power from the DC power source via the power supply terminals of the two connector fitting portions 57 and 67. The board 42 is supplied with, for example, the DC power supplied to the board 43 via an inter-board connector.

On an end surface 12a of the motor 12 to which the control device 13 is attached, motor terminals 36A of three phases corresponding to the first winding group of the motor 12 and motor terminals 36B of three phases corresponding to the second winding group of the motor 12 are provided to protrude therefrom. The motor terminals 36A and 36B are parts of the bus bars 36 of three phases and are provided by drawing ends of the bus bars 36 to the outside of the motor 12.

Three motor terminals 36A are arranged in a line along a circumference of a cylindrical part of the case 21, specifically, along an inner circumferential surface of the cylindrical part, and are connected to a motor terminal connector 54 of the board 43. The motor terminal connector 54 is a connection portion group to which the three motor terminals 36A corresponding to three phases are connected. The connection portions of the three phases constituting the connection portion group are disposed at the same positions as the three motor terminals 36A.

Three motor terminals 36B are arranged in a line along the circumference of the cylindrical part of the case 21, specifically, along the inner circumferential surface of the cylindrical part, and are connected to a motor terminal connector 64 of the board 43. The motor terminal connector 64 is a connection portion group to which the three motor terminals 36B corresponding to three phases are connected. The connection portions of the three phases constituting the connection portion group are disposed at the same positions as the three motor terminals 36B.

Each of the motor terminal connectors 54 and 64 may be, for example, a terminal block of a rectangular parallelepiped shape. The three motor terminals 36A and the three motor terminals 36B may be arranged in an arc shape along the inner circumferential surface of the cylindrical part of the case 21.

Figure 3:
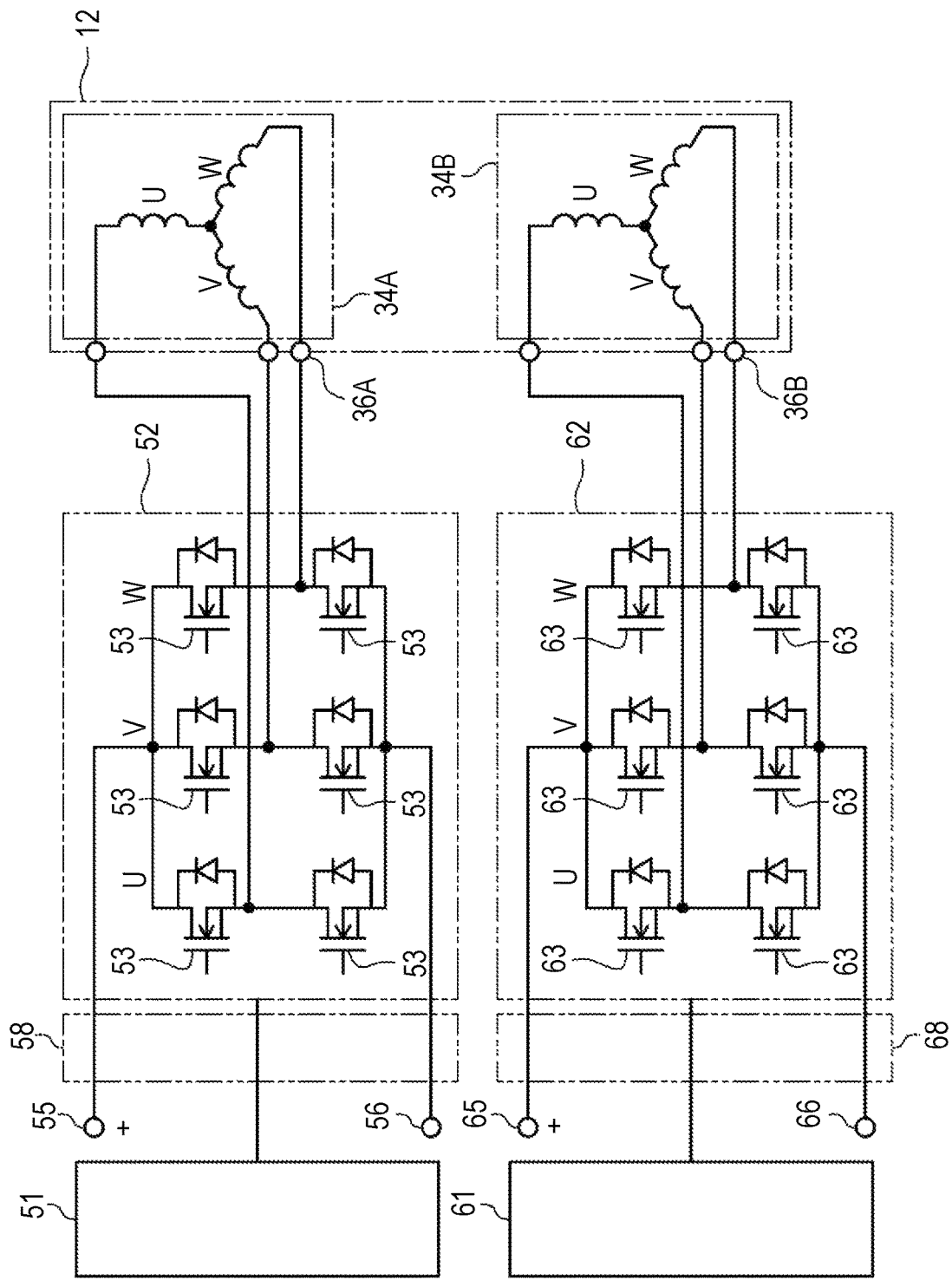
FIG. 3 is a circuit diagram of the motor control device according to the first embodiment.

An electrical configuration of the motor system 11 will be described below. As illustrated in FIG. 3, the motor system 11 includes a first winding group 34A of the motor 12, an inverter circuit 52, and a microcomputer 51 as elements of a first system.

In the inverter circuit 52, three legs with two FETs 53 and 53 connected in series included in each leg are connected in parallel between the power supply terminal connector 55 and the ground terminal connector 56. Specifically, three legs of the inverter circuit 52 are connected between the power supply terminal connector 55 and the ground terminal connector 56 via a filter 58. The filter 58 includes a coil provided in series to a power supply line and a capacitor connected between the power supply line and a ground line. A connection path between the filter 58 and the inverter circuit 52 branches into three paths at a power supply branching point on the way on the power supply side and the ground side, and the branching paths are connected to power-supply-side ends and ground-side ends of the three legs. The configuration of the filter 58 and the connection method of the filter 58 to the inverter circuit 52 are known and thus detailed description thereof will be omitted. The power supply terminal connector 55 is connected to a + terminal of a DC power source and the ground terminal connector 56 is connected to a − terminal of the DC power source. The filter 58 removes noise which is superimposed on DC power supplied from the power supply terminal connector 55 by performing a filtering process on the DC power.

In the first winding group 34A, for example, a U-phase winding, a V-phase winding, and a W-phase winding are start-connected. An end of each winding opposite to a neutral point of the phase windings is connected to a midpoint of the leg of the corresponding phase in the inverter circuit 52 via the corresponding motor terminal 36A.

The microcomputer 51 serves as a control circuit that controls the operation of the inverter circuit 52. The microcomputer 51 generates a switching command for the FETs 53 of the inverter circuit 52 based on a rotation angle of the motor 12 which is detected by the rotation angle sensor. By causing the FETs 53 of the inverter circuit 52 to switch based on the switching command generated by the microcomputer 51, DC power supplied from the DC power source is converted to AC power of three phases. The AC power generated by the inverter circuit 52 is supplied to the first winding group 34A of the motor 12 via the motor terminals 36A.

The motor system 11 includes a second winding group 34B of the motor 12, an inverter circuit 62, and a microcomputer 61 as elements of a second system. In the inverter circuit 62, three legs with two FETs 63 and 63 connected in series and included in each leg are connected in parallel between the power supply terminal connector 65 and the ground terminal connector 66. Specifically, three legs of the inverter circuit 62 are connected between the power supply terminal connector 65 and the ground terminal connector 66 via a filter 68. A connection path between the filter 68 and the inverter circuit 62 branches into three paths at a power supply branching point on the way on the power supply side and the ground side, and the branching paths are connected to power-supply-side ends and ground-side ends of the three legs. The power supply terminal connector 65 is connected to the + terminal of the DC power source and the ground terminal connector 66 is connected to the − terminal of the DC power source. The filter 68 removes noise which is superimposed on DC power supplied from the power supply terminal connector 65 by performing a filtering process on the DC power.

In the second winding group 34B, for example, a U-phase winding, a V-phase winding, and a W-phase winding are start-connected. An end of each winding opposite to a neutral point of the phase windings is connected to a midpoint of the leg of the corresponding phase in the inverter circuit 62 via the corresponding motor terminal 36B.

The microcomputer 61 serves as a control circuit that controls the operation of the inverter circuit 62. The microcomputer 61 generates a switching command for the FETs 63 of the inverter circuit 62 based on a rotation angle of the motor 12 which is detected by the rotation angle sensor. By causing the FETs 63 of the inverter circuit 62 to switch based on the switching command generated by the microcomputer 61, DC power supplied from the DC power source is converted to AC power of three phases. The AC power generated by the inverter circuit 62 is supplied to the second winding group 34B of the motor 12 via the motor terminals 36B.

Figure 4:
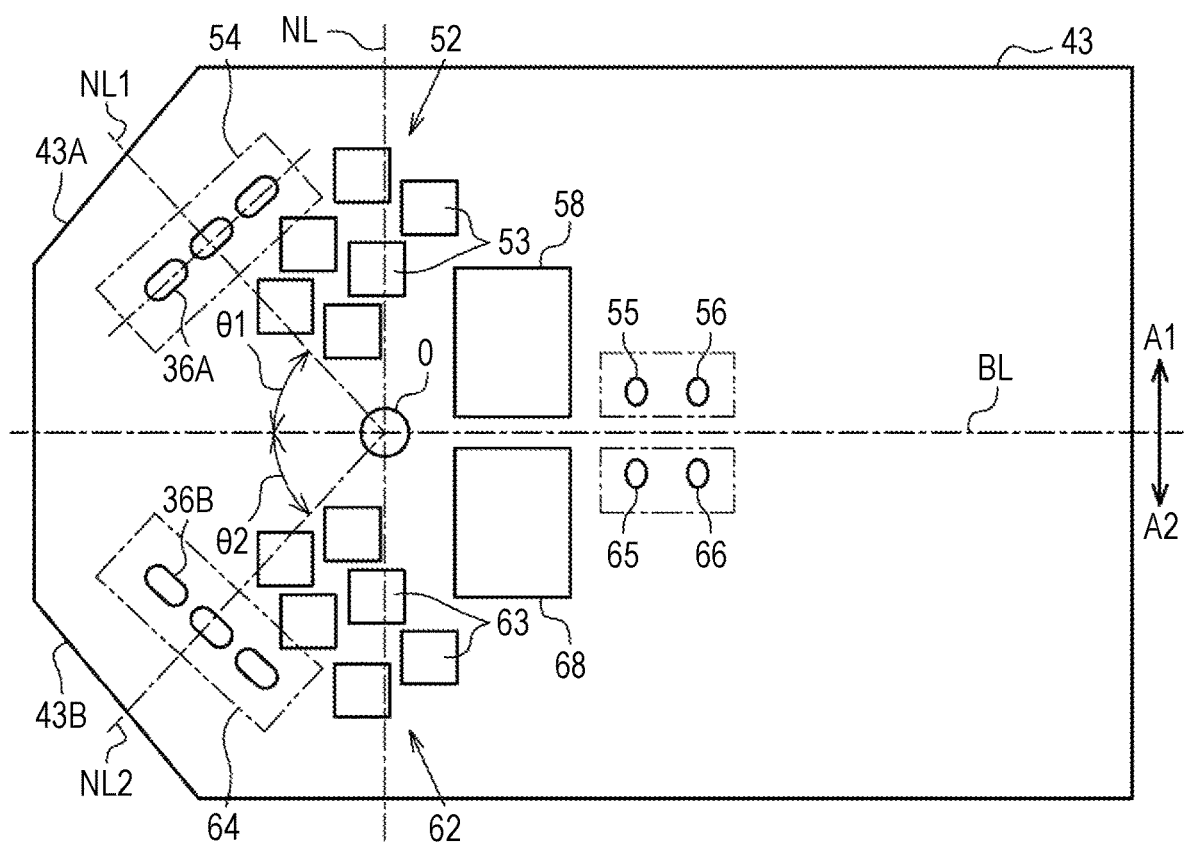
FIG. 4 is a plan view of a power board according to the first embodiment.

A layout of the elements provided on the board 43 will now be described. As illustrated in FIG. 4, the board 43 has a hexagonal plate shape when viewed in a direction parallel to an axis O of the motor 12. In the board 43, oblique sides 43A and 43B are provided at two corners neighboring in a short side direction of a rectangle when viewed in the direction parallel to the axis O of the motor 12. The board 43 is partitioned into a first area A1 and a second area A2 by a boundary line BL. The boundary line BL extends along a long side of the board 43. The boundary line BL passes through the axis O which is the center of the motor 12 when viewed in the direction parallel to the axis O of the motor 12.

The motor terminal connector 54, the inverter circuit 52, the filter 58, the power supply terminal connector 55, and the ground terminal connector 56 are provided in the first area A1 of the board 43. The motor terminal connector 54, the inverter circuit 52, the filter 58, the power supply terminal connector 55, and the ground terminal connector 56 are arranged in that order from a first end of the board 43 to a second end thereof. The first end is an end of the board 43 on which the oblique side 43A is provided. The second end is an end of the board 43 opposite to the first end in a direction parallel to the boundary line BL.

The motor terminal connector 54 and the inverter circuit 52 are located close to the first end of the board 43 when viewed in the direction parallel to the axis O of the motor 12. In the board 43, the motor terminal connector 54 and the inverter circuit 52 approximately belong to an area close to the first end with respect to a straight line NL which is perpendicular to the boundary line BL and which passes through the axis O of the motor 12. The power supply terminal connector 55, the ground terminal connector 56, and the filter 58 belong to an area close to the second end with respect to the straight line NL.

The motor terminal connector 54 is inclined along the oblique side 43A of the board 43. The motor terminal connector 54 is also inclined with respect to the boundary line BL. Three motor terminals 36A of the first system connected to the motor terminal connector 54 are obliquely arranged along the motor terminal connector 54. An angle θ1 formed by a straight line NL1 perpendicular to a direction in which the three motor terminals 36A are arranged and passing through the axis O of the motor 12 and the boundary line BL is set to an acute angle which is an angle less than 90°. Preferably, the three motor terminals 36A are arranged such that the straight line NL1 passes through the center of a central terminal out of the three motor terminals 36A. When the three motor terminals 36A are arranged in a line in an arc shape along the inner circumferential surface of the cylindrical part of the case 21, a direction connecting the terminals at both ends of the three motor terminals 36A is set as the arrangement direction of the motor terminals 36A.

The inverter circuit 52 is located inside of the motor terminal connector 54 when viewed in the direction parallel to the axis O of the motor 12. The inside of the motor terminal connector 54 is a side approaching the axis O which is the center of the motor 12 with respect to the motor terminal connector 54 when viewed in the direction parallel to the axis O of the motor 12. Three FETs 53 on the power supply side and three FETs 53 on the ground side (three phase legs) in the inverter circuit 52 are arranged in an extending direction of the motor terminal connector 54, that is, in the direction in which three motor terminals 36A are arranged. In the inverter circuit 52, the FETs 53 on the ground side are located on the motor terminal connector 54 side, and the FETs 53 on the power supply side are located on a side opposite to the motor terminal connector 54 side with respect to the FETs 53 on the ground side.

In the board 43, the power supply terminal connector 55 and the ground terminal connector 56 are disposed in an area on the side of the second end with respect to a straight line NL perpendicular to the boundary line BL and passing through the axis O of the motor 12. The power supply terminal connector 55 and the ground terminal connector 56 are arranged along the boundary line BL. The power supply terminal connector 55 is located on the side of the first end of the board 43 (on the left side in FIG. 4), and the ground terminal connector 56 is located on the side of the second end of the board 43 (on the right side in FIG. 4).

A current path between the power supply terminal connector 55 and each motor terminal 36A is set based on an idea that the power supply terminal connector 55 and the motor terminal 36A are connected by a straight line or a path as close to a straight line as possible in an allowable range from a viewpoint of the layout of elements on the board 43. A current path between the ground terminal connector 56 and each FET 53 on the ground side of the inverter circuit 52 is also set based on an idea that the ground terminal connector 56 and the FET 53 on the ground side are connected by a straight line or a path as close to a straight line as possible in an allowable range from a viewpoint of the layout of elements on the board 43.

The motor terminal connector 64, the inverter circuit 62, the filter 68, the power supply terminal connector 65, and the ground terminal connector 66 are provided in the second area A2 of the board 43. The motor terminal connector 64, the inverter circuit 62, the filter 68, the power supply terminal connector 65, and the ground terminal connector 66 are located at positions which are symmetric with the motor terminal connector 54, the inverter circuit 52, the filter 58, the power supply terminal connector 55, and the ground terminal connector 56 in the first area A1 with respect to the boundary line BL.

The motor terminal connector 64 is inclined along the oblique side 43B of the board 43. The motor terminal connector 64 is also inclined with respect to the boundary line BL. Three motor terminals 36B of the second system connected to the motor terminal connector 64 are obliquely arranged along the motor terminal connector 64. An angle θ2 formed by a straight line NL2 perpendicular to a direction in which the three motor terminals 36B are arranged and passing through the axis O of the motor 12 and the boundary line BL is set to an acute angle which is an angle less than 90°. The angle θ2 is set to the same angle as the aforementioned angle θ1. Here, the angle θ2 may be set to an angle different from the angle θ1. An angle formed by the two straight lines NL1 and NL2 is set to an angle less than 180°. Preferably, the three motor terminals 36B are arranged such that the straight line NL2 passes through the center of a central terminal out of the three motor terminals 36B. When the three motor terminals 36B are arranged in a line in an arc shape along the inner circumferential surface of the cylindrical part of the case 21, a direction connecting the terminals at both ends of the three motor terminals 36B is set as the arrangement direction of the motor terminals 36B.

The inverter circuit 62 is located inside of the motor terminal connector 64 when viewed in the direction parallel to the axis O of the motor 12. The inside of the motor terminal connector 64 is a side approaching the axis O which is the center of the motor 12 with respect to the motor terminal connector 64 when viewed in the direction parallel to the axis O of the motor 12. The three phase legs, that is, three FETs 63 on the ground side and three FETs 63 on the power supply side, in the inverter circuit 62 are arranged in an extending direction of the motor terminal connector 64, that is, in the direction in which three motor terminals 36B are arranged. In the inverter circuit 62, the FETs 63 on the ground side are located on the motor terminal connector 64 side, and the FETs 63 on the power supply side are located on a side opposite to the motor terminal connector 64 side with respect to the FETs 63 on the ground side.

A current path between the power supply terminal connector 65 and each motor terminal 36B is set based on an idea that the power supply terminal connector 65 and the motor terminal 36B are connected by a straight line or a path as close to a straight line as possible in an allowable range from a viewpoint of the layout of elements on the board 43. A current path between the ground terminal connector 66 and each FET 63 on the ground side of the inverter circuit 62 is also set based on an idea that the ground terminal connector 66 and the FET 63 on the ground side are connected by a straight line or a path as close to a straight line as possible in an allowable range from a viewpoint of the layout of elements on the board 43.

An example of comparison between the layout of the board 43 according to the embodiment and that according to a comparative example will be described below. In the comparative example, the motor terminal connectors 54 and 64 of two systems are disposed at positions which are symmetric with respect to the boundary line BL. The motor terminal connectors 54 and 64 of two systems are located on the opposite sides of the axis O of the motor 12 in a direction parallel to a straight line NL.

Figure 5:
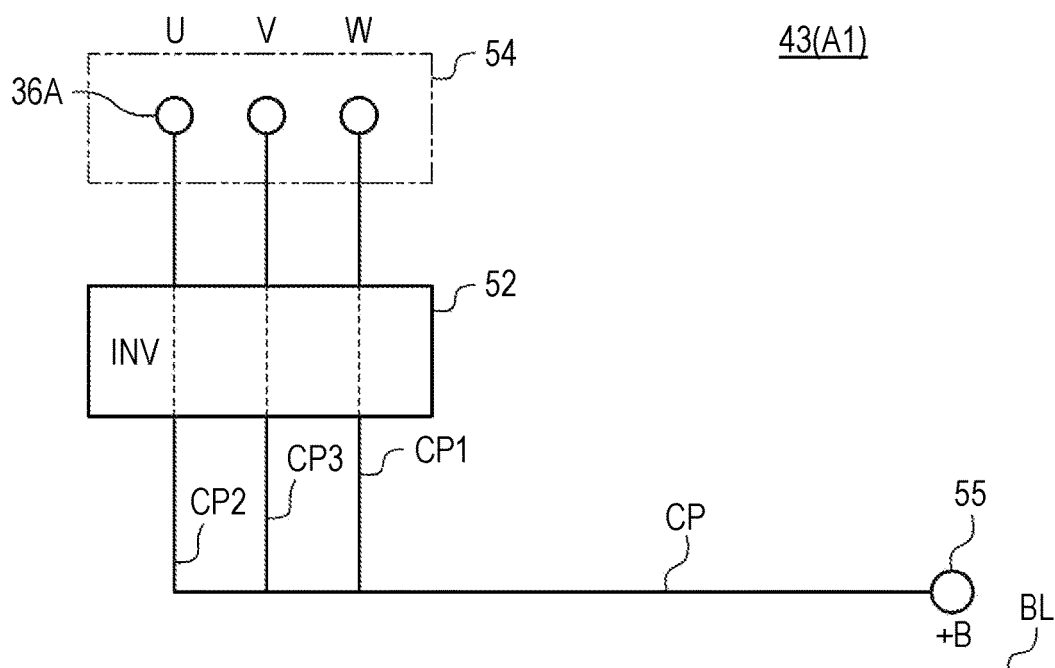
FIG. 5 is a diagram schematically illustrating current paths of three phases from a power supply terminal connector to a motor terminal connector according to a comparative example.

As illustrated in FIG. 5, a current path from the power supply terminal connector 55 to the motor terminal connector 54 in the first system is bent in an L shape. The inverter circuit 52 and the motor terminal connector 54 are arranged in a direction perpendicular to the boundary line BL. The inverter circuit 52 is provided at a position closer to the boundary line BL than the motor terminal connector 54 in the direction perpendicular to the boundary line BL. The power supply terminal connector 55 is provided at a position closer to the boundary line BL than the inverter circuit 52 in the direction perpendicular to the boundary line BL. The power supply terminal connector 55 is provided on one side (the right side in FIG. 5) of the inverter circuit 52 in the direction parallel to the boundary line BL.

When this layout is employed, the current path from the power supply terminal connector 55 to the phase legs of the inverter circuit 52 is bent, for example, from the direction parallel to the boundary line BL to the direction perpendicular to the boundary line BL. In this case, the current path CP from the power supply terminal connector 55 to the phase legs (the FETs 53 on the power supply side) of the inverter circuit 52 branches into three current paths CP1, CP2, and CP3 on the way. The current path CP1 is a current path closest to the power supply terminal connector 55 in the direction parallel to the boundary line BL. The current path CP2 is a current path farthest from the power supply terminal connector 55 in the direction parallel to the boundary line BL. The current path CP3 is a current path located between the current path CP1 and the current path CP2 in the direction parallel to the boundary line BL.

Accordingly, a difference in length of a current path is generated between the current path CP1 passing through a part closer to the power supply terminal connector 55 and the current path CP2 or the current path CP3 passing through a part farther from the power supply terminal connector 55 in the direction parallel to the boundary line BL. A difference in length of a current path is also generated between the current path CP3 passing through a part closer to the power supply terminal connector 55 and the current path CP2 passing through a part farther from the power supply terminal connector 55.

In the current path from the power supply terminal connector 65 to the phase legs (the FETs 63 on the power supply side) of the inverter circuit 62 in the second system, similarly to the first system, a difference in length of a current path is generated between the current path passing through a part closer to the power supply terminal connector 65 and the current path passing through a part farther from the power supply terminal connector 65. A difference in length of a current path is also generated between current paths from the ground terminal connector 56 to the FETs 53 on the ground side in the first system and between current paths from the ground terminal connector 66 to the FETs 63 on the ground side in the second system.

A difference in electrical resistance is generated between the current paths of three phases due to the difference in length between the current paths of three phases. The difference in electrical resistance between the current paths of three phases is also a factor for generating torque ripples in the motor 12.

Figure 6:
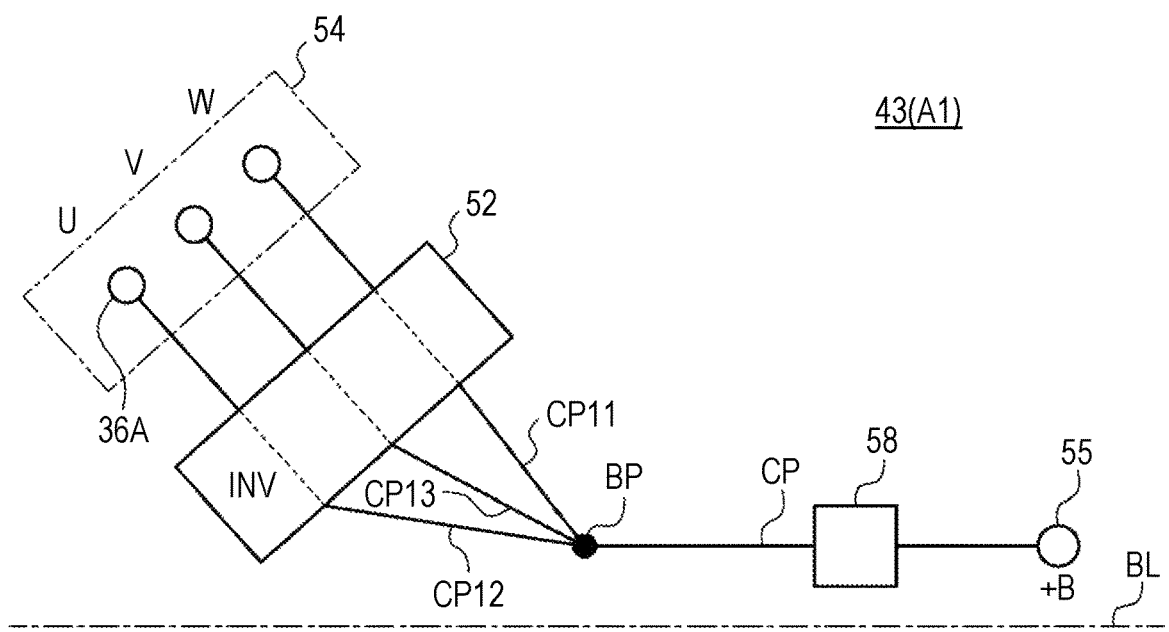
FIG. 6 is a diagram schematically illustrating current paths of three phases from a power supply terminal connector to a motor terminal connector according to the first embodiment.

Therefore, in this embodiment, the following layout is employed as the layout of the board 43. As illustrated in FIG. 6, in the first area A1 of the board 43, the motor terminal connector 54, the inverter circuit 52, the filter 58, and the power supply terminal connector 55 are arranged in that order along the boundary line BL. The direction in which the motor terminal connector 54 and the inverter circuit 52 are arranged is inclined with respect to the boundary line BL. The inverter circuit 52 is provided at a position closer to the boundary line BL than the motor terminal connector 54 in the direction perpendicular to the boundary line BL. The filter 58 and the power supply terminal connector 55 are provided on one side of the inverter circuit 52 in the direction parallel to the boundary line BL. By disposing the arrangement direction of the motor terminal connector 54 and the inverter circuit 52 to be oblique with respect to the boundary line BL, the motor terminal connector 54, the inverter circuit 52, the filter 58, and the power supply terminal connector 55 can be made to be close to a state in which they are arranged in a line along the boundary line BL.

The current path between the power supply terminal connector 55 and the motor terminals 36A is set based on an idea that the power supply terminal connector 55 and the motor terminal 36A are connected by a straight line or a path as close to a straight line as possible in an allowable range from a viewpoint of the layout of elements on the board 43. The current path CP from the power supply terminal connector 55 to the phase legs (the FETs 53 on the power supply side) of the inverter circuit 52 is bent according to a degree of inclination of the inverter circuit 52 from the direction parallel to the boundary line BL to the direction crossing the boundary line BL.

The current path CP from the power supply terminal connector 55 to the phase legs of the inverter circuit 52 branches into three current paths CP11, CP12, and CP13 at a power supply branching point BP for the phase legs. The current path CP11 is a current path farthest from the boundary line BL. The current path CP12 is a current path closest to the boundary line BL. The current path CP13 is a current path located between the current path CP11 and the current path CP12. Preferably, these three current paths CP11, CP12, and CP13 are independent single paths and are paths as straight as possible. The filter 58 is disposed between the power supply terminal connector 55 and the power supply branching point BP in the current path CP.

In the example illustrated in FIG. 6, for the purpose of convenience of explanation, the motor terminals 36A of the phases connected to the motor terminal connector 54 and the phase legs of the inverter circuit 52 correspond to each other in the arrangement direction of the motor terminals 36A of the phases. The three current paths from the phase legs to the motor terminals 36A of the phases are provided in a linear shape. The lengths of the three current paths from the inverter circuit 52 to the motor terminals 36A of the phases in the motor terminal connector 54 are set to substantially the same length.

Accordingly, by providing the motor terminal connector 54 and the inverter circuit 52 to be oblique with respect to the boundary line BL, the motor terminal connector 54, the inverter circuit 52, the filter 58, and the power supply terminal connector 55 are made to be close to a state in which they are arranged in a line along the boundary line BL. As a result, in comparison with the L-shaped current paths in the comparative example illustrated in FIG. 5, the degrees of bending of the current paths from the power supply terminal connector 55 to the phase legs of the inverter circuit 52 are decreased by the inclination of an acute angle of the motor terminal connector 54 and the inverter circuit 52. By providing the current paths between the motor terminals 36A and the power supply branching point BP based on an idea that they are made to be close to a straight line, a difference in length between the current paths from the motor terminals 36A to the power supply branching point BP for the phase legs is decreased. The difference in length between the total current paths from the power supply terminal connector 55 to the motor terminals 36A of the phases is decreased.

When the motor terminals 36A of the phases and the phase legs of the inverter circuit 52 are deviated from each other in the arrangement direction of the motor terminals 36A of the phases, the current paths between the motor terminals 36A of the phases and the power supply branching point BP are provided as follows. That is, the current paths between the motor terminals 36A of the phases and the power supply branching point BP are provided based on an idea that the motor terminals 36A of the phases and the power supply branching point BP are connected by a straight line or a path as close to a straight line as possible in an allowable range from a viewpoint of the layout of elements on the board 43. With this configuration, it is possible to decrease a difference in length of a current path between the motor terminals 36A and the power supply branching point BP for the phase legs of the inverter circuit 52.

Although not illustrated, the current paths between the ground terminal connector 56 and the FETs 53 on the ground side of the inverter circuit 52 are set based on an idea that the ground terminal connector 56 and each FET 53 on the ground side are connected by a straight line or a path as close to a straight line as possible in an allowable range from a viewpoint of the layout of elements on the board 43. Accordingly, it is possible to decrease a difference in length of a current path between the ground terminal connector 56 and the FETs 53 on the ground side of the inverter circuit 52.

The current paths from the power supply terminal connector 65 to the phase legs of the inverter circuit 62 in the second system are the same as those in the first system. That is, by providing the current paths between the motor terminals 36B and the power supply branching point BP based on an idea that they are provided to be closer to a straight line, a difference in length of a current path between the motor terminals 36B and the power supply branching point BP for phase legs of the inverter circuit 62 is decreased. A difference in length between the total current paths from the power supply terminal connector 65 to the motor terminals 36B of the phases is decreased.

The current paths between the ground terminal connector 66 and the FETs 63 on the ground side of the inverter circuit 62 are set based on an idea that the ground terminal connector 66 and each FET 63 on the ground side are connected by a straight line or a path as close to a straight line as possible in an allowable range from a viewpoint of the layout of elements on the board 43. Accordingly, it is possible to decrease a difference in length between the current paths from the ground terminal connector 66 to the FETs 63 on the ground side of the inverter circuit 62.

Accordingly, according to the first embodiment, the following advantages can be achieved. (1) The difference in length between the current paths from the motor terminals 36A of the phases to the power supply branching point BP for the phase legs of the inverter circuit 52 and the difference in length between the total current paths from the power supply terminal connector 55 to the motor terminals 36A of the phases in the first system are decreased. As a result, the difference in electrical resistance between the power supply terminal connector 55 and the motor terminals 36A of the phases is also decreased. That is, the electrical resistance between the power supply terminal connector 55 and the motor terminals 36A of the phases is further uniformized. The same advantages as in the first system are achieved for the second system. Accordingly, it is possible to decrease torque ripples which are fluctuation of a torque generated from the motor 12.

(2) The motor terminal connector 54 of the first system is provided along the oblique side 43A of the board 43. Accordingly, by providing the motor terminal connector 54 to be closer to the oblique side 43A of the board 43, it is possible to reduce a dead space in the board 43. It is also possible to shorten the length in the direction parallel to the boundary line BL extending along the long side of the board 43.

Second Embodiment

A motor control device according to a second embodiment will be described below. This embodiment basically has the same configuration as that in the first embodiment illustrated in FIGS. 1 to 4.

Figure 8:
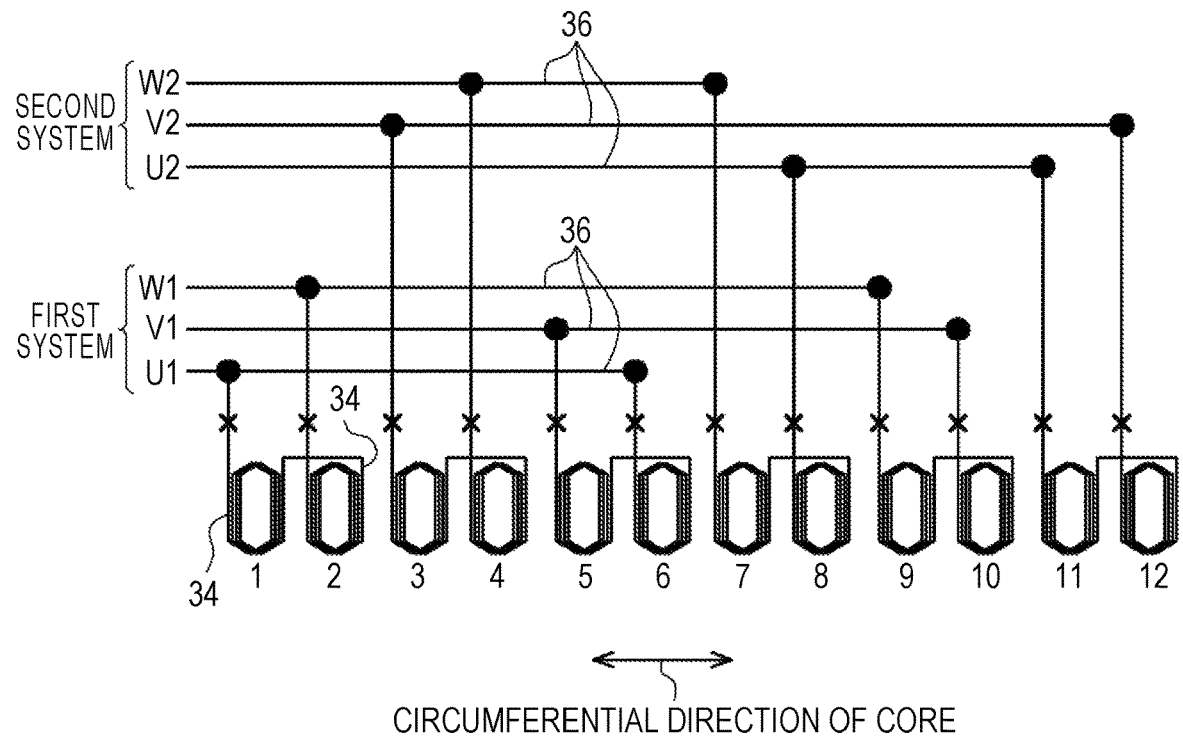
FIG. 8 is a connection diagram of coils of a motor according to the second embodiment.

As illustrated in FIG. 8, the motor 12 includes first to twelfth windings 34. The first, second, fifth, sixth, ninth, and tenth windings 34 constitute a first winding group 34A. The third, fourth, seventh, eighth, eleventh, and twelfth windings 34 constitute a second winding group 34B. The windings 34 are connected to the motor terminals 36A and 36B of the phases via the bus bars 36 of the corresponding phases in the bus bar module 24.

In the motor 12, a so-called tandem type winding is used as each winding 34. The tandem type winding is a winding in which two windings 34 and 34 neighboring in the circumferential direction of the core 31 of the motor 12 are connected in series. In FIG. 8, "x" indicates an end of each winding 34, and a "black solid circle" indicates a connection point between each winding 34 and the bus bar 36 of the corresponding phase.

A connection method of the first winding group 34A will be described below. A first end of the first winding 34 is connected to a U-phase (U1) motor terminal 36A in the first system via the corresponding bus bar 36. A second end of the first winding 34 is connected to a first end of the second winding 34. A second end of the second winding 34 is connected to a W-phase (W1) motor terminal 36A in the first system via the corresponding bus bar 36.

A first end of the fifth winding 34 is connected to a V-phase (V1) motor terminal 36A in the first system via the corresponding bus bar 36. A second end of the fifth winding 34 is connected to a first end of the sixth winding 34. A second end of the sixth winding 34 is connected to a U-phase (U1) motor terminal 36A in the first system via the corresponding bus bar 36.

A first end of the ninth winding 34 is connected to a W-phase (W1) motor terminal 36A in the first system via the corresponding bus bar 36. A second end of the ninth winding 34 is connected to a first end of the tenth winding 34. A second end of the tenth winding 34 is connected to a V-phase (V1) motor terminal 36A in the first system via the corresponding bus bar 36.

A connection method of the second winding group 34B will be described below. A first end of the third winding 34 is connected to a V-phase (V2) motor terminal 36B in the second system via the corresponding bus bar 36. A second end of the third winding 34 is connected to a first end of the fourth winding 34. A second end of the fourth winding 34 is connected to a W-phase (W2) motor terminal 36B in the second system via the corresponding bus bar 36.

A first end of the seventh winding 34 is connected to a W-phase (W2) motor terminal 36B in the second system via the corresponding bus bar 36. A second end of the seventh winding 34 is connected to a first end of the eighth winding 34. A second end of the eighth winding 34 is connected to a U-phase (U2) motor terminal 36B in the second system via the corresponding bus bar 36.

A first end of the eleventh winding 34 is connected to a U-phase (U2) motor terminal 36B in the second system via the corresponding bus bar 36. A second end of the eleventh winding 34 is connected to a first end of the twelfth winding 34. A second end of the twelfth winding 34 is connected to a V-phase (V2) motor terminal 36B in the second system via the corresponding bus bar 36.

In this way, the so-called tandem type winding in which two windings 34 and 34 neighboring in the circumferential direction of the core 31 are connected in series is used as each winding 34 of the motor 12. Accordingly, it is possible to reduce the number of connection points between the windings 34 of the motor 12 and the bus bars 36 of the corresponding phases.

Figure 9:
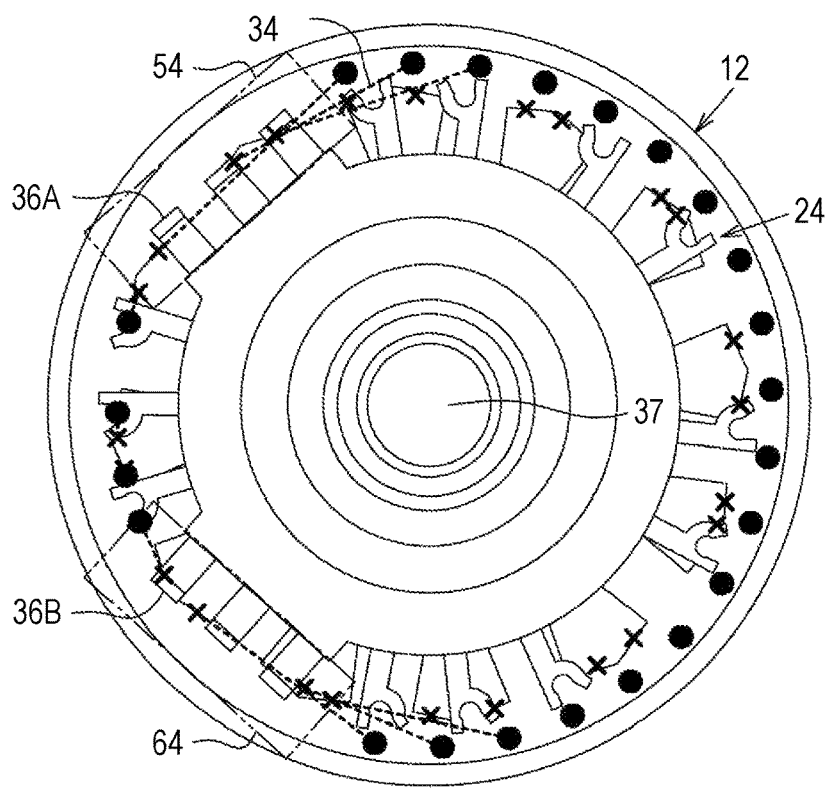
FIG. 9 is a plan view of a bus bar module according to a comparative example.

For example, when a single coil is employed as each winding 34 of the motor 12, the number of connection points between the windings 34 and the bus bars 36 are 24 as indicated by black solid circles in FIG. 9. This is because two ends of each single coil need to be connected to the corresponding bus bars 36. On the other hand, when a tandem type coil is employed as each winding 34 of the motor 12, the number of connection points between the windings 34 and the bus bars 36 are 12 as indicated by black solid circles in FIG. 7. That is, when a tandem type coil is used, the number of connection points between the windings 34 and the bus bars 36 is half that when a single coil is used.

Accordingly, according to the second embodiment, the following advantages can be achieved. (3) A tandem type winding is used as each winding 34 of the motor 12. Accordingly, in comparison with a case in which a single winding is employed as each winding 34 of the motor 12, it is possible to decrease the number of connection points between the windings 34 of the motor 12 and the bus bars 36. Accordingly, it is possible to improve a degree of freedom in installation of the motor terminals 36A and 36B. It is also possible to improve a degree of freedom in arrangement of the motor terminal connectors 54 and 64. Accordingly, the motor terminal connectors 54 and 64 can be easily provided to be oblique with respect to the boundary line BL.

Figure 7:
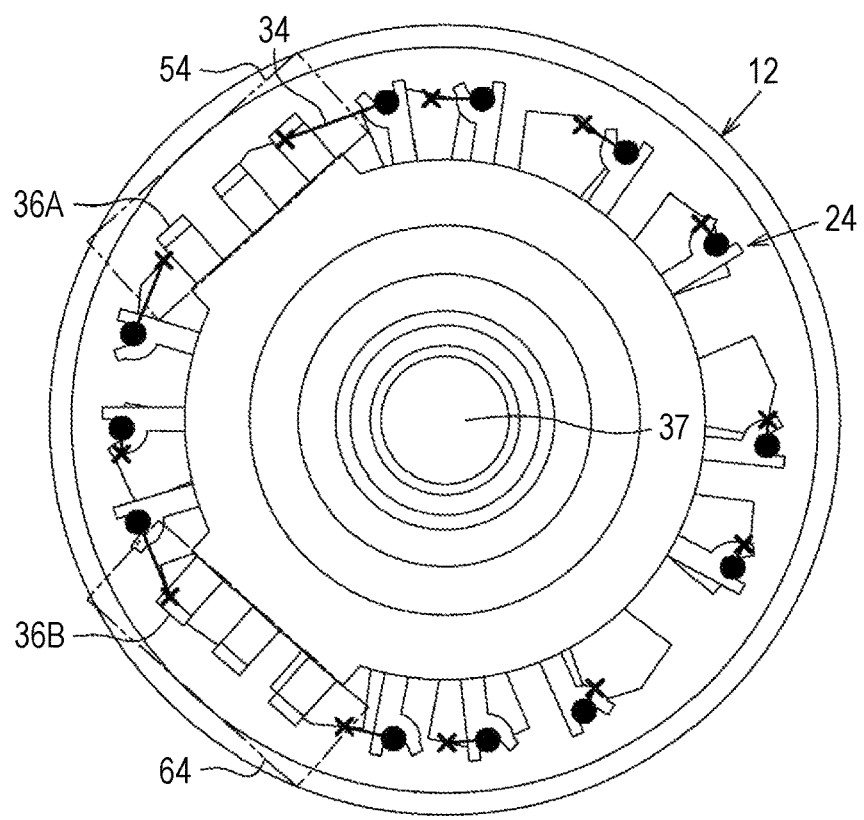
FIG. 7 is a plan view of a bus bar module according to a second embodiment.

(4) When a single winding is employed as each winding 34 of the motor 12 as indicated by a dotted line in FIG. 9, a distance by which ends of the windings 34 are handled may be increased and thus the ends of the windings 34 may cross each other. In this regard, when a tandem type winding is employed as each winding 34 of the motor 12, the number of connection points between the windings 34 of the motor 12 and the bus bars 36 is decreased and thus the degree of freedom in arrangement of the motor terminal connectors 54 and 64 is improved. Accordingly, it is possible to prevent the ends of the windings 34 from crossing each other as illustrated in FIG. 7. As a result, it is possible to secure insulating performance of the motor 12.

Third Embodiment

A motor control device according to a third embodiment will be described below. This embodiment is different from the first embodiment in the layout of elements provided on the board 43.

Figure 10:
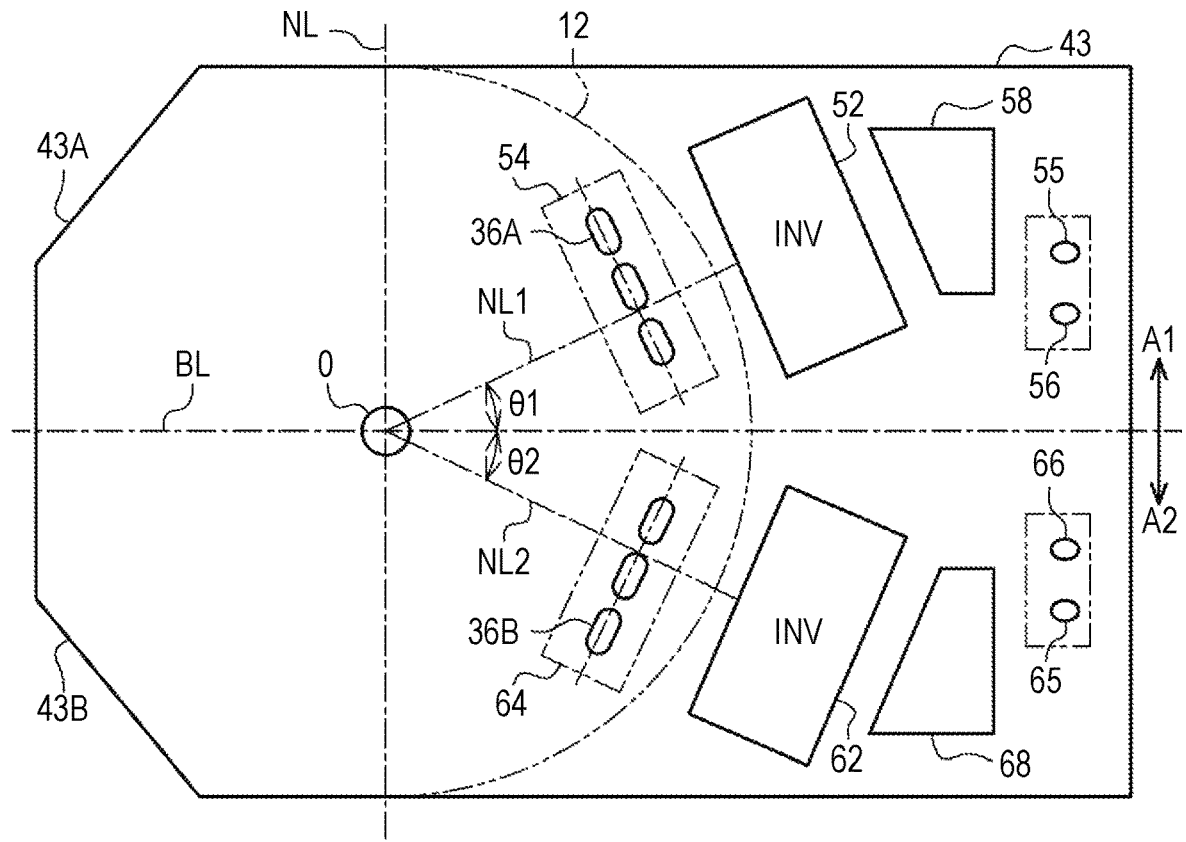
FIG. 10 is a plan view of a power board according to a third embodiment.

As illustrated in FIG. 10, similarly to the first embodiment, the board 43 has a hexagonal plate shape in which oblique sides 43A and 43B are formed at two corners of a rectangle when viewed in the direction parallel to the axis O of the motor 12. The board 43 is partitioned into a first area A1 and a second area A2 by a boundary line BL. The boundary line BL extends along a long side of the board 43. The boundary line BL passes through the axis O which is the center of the motor 12 when viewed in the direction parallel to the axis O of the motor 12.

The motor terminal connector 54, the inverter circuit 52, the filter 58, the power supply terminal connector 55, and the ground terminal connector 56 are provided in the first area A1 of the board 43. The motor terminal connector 54, the inverter circuit 52, the filter 58, the power supply terminal connector 55, and the ground terminal connector 56 belong to an area close to a second end (the right side in FIG. 10) with respect to a straight line NL perpendicular to the boundary line BL and passing through the axis O of the motor 12. The motor terminal connector 54, the inverter circuit 52, the filter 58, the power supply terminal connector 55, and the ground terminal connector 56 are arranged in that order from a first end of the board 43 to the second end thereof. The first end is an end of the board 43 on which the oblique side 43A is provided. The second end is an end of the board 43 opposite to the first end in the direction parallel to the boundary line BL.

The inverter circuit 52 is located outside of the motor terminal connector 54 when viewed in the direction parallel to the axis O of the motor 12. The outside of the motor terminal connector 54 is a side away from the axis O which is the center of the motor 12 with respect to the motor terminal connector 54 when viewed in the direction parallel to the axis O of the motor 12. Although not illustrated, the FETs 53 on the ground side in the inverter circuit 52 are located on the motor terminal connector 54 side, and the FETs 53 on the power supply side are located on the side opposite to the motor terminal connector 54 side with respect to the FETs 53 on the ground side.

The motor terminal connector 54 is inclined in a tangent direction of the outline of the motor 12 indicated by a two-dot chain line in FIG. 10 when viewed in the direction parallel to the axis O of the motor 12. Three motor terminals 36A of the first system connected to the motor terminal connector 54 are arranged obliquely in the tangent direction of the outline of the motor 12. An angle θ1 which is formed by a straight line NL1 perpendicular to the arrangement direction of the three motor terminals 36A and passing through the axis O of the motor 12 and the boundary line BL is set to an acute angle which is an angle less than 90°. Preferably, three motor terminals 36A are arranged such that the straight line NL1 passes through the center of the central terminal out of the three motor terminals 36A. Although not illustrated, three FETs 53 on the power supply side and three FETs 53 on the ground side (three phase legs) in the inverter circuit 52 are arranged in the extending direction of the motor terminal connector 54, that is, obliquely in the tangent direction of the outline of the motor 12.

The power supply terminal connector 55 and the ground terminal connector 56 are provided in the vicinity of the second end of the board 43. The power supply terminal connector 55 and the ground terminal connector 56 are arranged along the short side of the board 43. The ground terminal connector 56 is provided at a position closer to the boundary line BL than the power supply terminal connector 55.

Current paths between the power supply terminal connector 55 and the motor terminals 36A are set based on an idea that the power supply terminal connector 55 and the motor terminals 36A are connected by a straight line or a path as close to a straight line as possible in an allowable range from a viewpoint of the layout of elements on the board 43. Current paths between the ground terminal connector 56 and the FETs 53 on the ground side of the inverter circuit 52 are also set based on an idea that the ground terminal connector 56 and the FETs 53 on the ground side are connected by a straight line or a path as close to a straight line as possible in an allowable range from a viewpoint of the layout of elements on the board 43.

The motor terminal connector 64, the inverter circuit 62, the filter 68, the power supply terminal connector 65, and the ground terminal connector 66 are provided in the second area A2 of the board 43. The motor terminal connector 64, the inverter circuit 62, the filter 68, the power supply terminal connector 65, and the ground terminal connector 66 are located at positions which are symmetric with the motor terminal connector 54, the inverter circuit 52, the power supply terminal connector 55, and the ground terminal connector 56 in the first area A1 with respect to the boundary line BL.

The motor terminal connector 64 is inclined in the tangent direction of the outline of the motor 12 indicated by the two-dot chain line in FIG. 10 when viewed in the direction parallel to the axis O of the motor 12. Three motor terminals 36B of the second system connected to the motor terminal connector 64 are arranged obliquely in the tangent direction of the outline of the motor 12. An angle θ2 which is formed by a straight line NL2 perpendicular to the arrangement direction of the three motor terminals 36B and passing through the axis O of the motor 12 and the boundary line BL is set to an acute angle which is an angle less than 90°. The angle θ2 is set to the same angle as the angle θ1. Here, the angle θ2 may be set to an angle different from the angle θ1. An angle formed by two straight lines NL1 and NL2 is set to an angle less than 180°. Preferably, three motor terminals 36B are arranged such that the straight line NL2 passes through the center of the central terminal out of the three motor terminals 36B. Although not illustrated, three FETs 63 on the power supply side and three FETs 63 on the ground side (three phase legs) in the inverter circuit 62 are arranged in the extending direction of the motor terminal connector 64, that is, obliquely in the tangent direction of the outline of the motor 12.

The power supply terminal connector 65 and the ground terminal connector 66 are provided in the vicinity of the second end of the board 43. The power supply terminal connector 65 and the ground terminal connector 66 are arranged along the short side of the board 43. The ground terminal connector 66 is provided at a position closer to the boundary line BL than the power supply terminal connector 65.

Current paths between the power supply terminal connector 65 and the motor terminals 36B are set based on an idea that the power supply terminal connector 65 and the motor terminals 36B are connected by a straight line or a path as close to a straight line as possible in an allowable range from a viewpoint of the layout of elements on the board 43. Current paths between the ground terminal connector 66 and the FETs 63 on the ground side of the inverter circuit 62 are also set based on an idea that the ground terminal connector 66 and the FETs 63 on the ground side are connected by a straight line or a path as close to a straight line as possible in an allowable range from a viewpoint of the layout of elements on the board 43.

Figure 11:
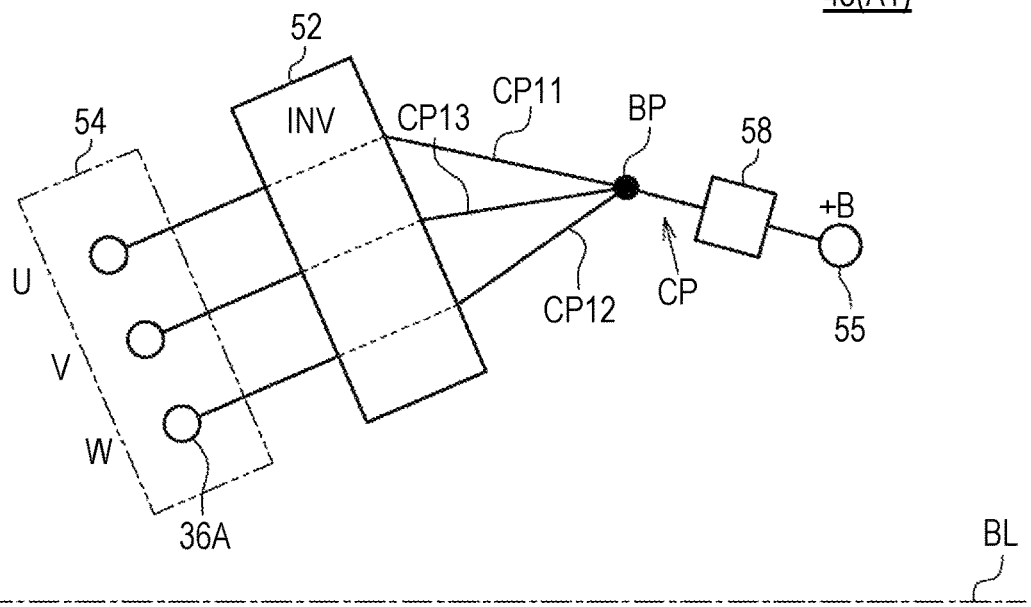
FIG. 11 is a diagram schematically illustrating current paths of three phases from a power supply terminal connector to a motor terminal connector according to the third embodiment.

As illustrated in FIG. 11, in the first area A1 of the board 43, the motor terminal connector 54, the inverter circuit 52, the filter 58, and the power supply terminal connector 55 are arranged in that order along the boundary line BL. The direction in which the motor terminal connector 54 and the inverter circuit 52 are arranged is inclined with respect to the boundary line BL. Accordingly, the motor terminal connector 54, the inverter circuit 52, the filter 58, and the power supply terminal connector 55 can be made to be close to a state in which they are arranged in a line along the boundary line BL. The motor terminal connector 54 is provided at a position closer to the boundary line BL than the inverter circuit 52 in the direction perpendicular to the boundary line BL. The power supply terminal connector 55 is provided on one side (the right side in FIG. 11) of the inverter circuit 52 in the direction parallel to the boundary line BL.

The current path between the power supply terminal connector 55 and the motor terminals 36A is set based on an idea that the power supply terminal connector 55 and the motor terminals 36A are connected by a straight line or a path as close to a straight line as possible in an allowable range from a viewpoint of the layout of elements on the board 43. The current path CP from the power supply terminal connector 55 to the phase legs (the FETs 53 on the power supply side) of the inverter circuit 52 is bent according to a degree of inclination of the inverter circuit 52 from the direction parallel to the boundary line BL to the direction crossing the boundary line BL.

The current path CP from the power supply terminal connector 55 to the phase legs of the inverter circuit 52 branches into three current paths CP11, CP12, and CP13 at a power supply branching point BP for the phase legs. The current path CP11 is a current path farthest from the boundary line BL. The current path CP12 is a current path closest to the boundary line BL. The current path CP13 is a current path located between the current path CP11 and the current path CP12. Preferably, these three current paths CP11, CP12, and CP13 are single paths and are paths as straight as possible.

In the example illustrated in FIG. 11, for the purpose of convenience of explanation, the motor terminals 36A of the phases connected to the motor terminal connector 54 and the phase legs of the inverter circuit 52 correspond to each other in the arrangement direction of the motor terminals 36A of the phases. The three current paths from the phase legs to the motor terminals 36A of the phases are provided in a linear shape. The lengths of the three current paths from the inverter circuit 52 to the motor terminals 36A of the phases in the motor terminal connector 54 are set to substantially the same length.

Accordingly, by providing the motor terminal connector 54 and the inverter circuit 52 to be oblique with respect to the boundary line BL, the motor terminal connector 54, the inverter circuit 52, the filter 58, and the power supply terminal connector 55 are made to be close to a state in which they are arranged in a line along the boundary line BL. As a result, in comparison with the L-shaped current paths in the comparative example illustrated in FIG. 5, the degrees of bending of the current paths from the power supply terminal connector 55 to the phase legs of the inverter circuit 52 are decreased by the inclination of an acute angle of the inverter circuit 52. By providing the current paths between the motor terminals 36A and the power supply branching point BP based on an idea that they are made to be close to a straight line, a difference in length between the current paths from the motor terminals 36A to the power supply branching point BP for the phase legs is decreased. The difference in length between the total current paths from the power supply terminal connector 55 to the motor terminals 36A of the phases is decreased.

When the motor terminals 36A of the phases and the phase legs of the inverter circuit 52 are deviated from each other in the arrangement direction of the motor terminals 36A of the phases, the current paths between the motor terminals 36A of the phases and the power supply branching point BP are provided as follows. That is, the current paths between the motor terminals 36A of the phases and the power supply branching point BP are provided based on an idea that the motor terminals 36A of the phases and the power supply branching point BP are connected by a straight line or a path as close to a straight line as possible in an allowable range from a viewpoint of the layout of elements on the board 43. With this configuration, it is possible to decrease a difference in length of a current path between the motor terminals 36A and the power supply branching point BP for the phase legs of the inverter circuit 52.

Although not illustrated, the current paths between the ground terminal connector 56 and the FETs 53 on the ground side of the inverter circuit 52 are set based on an idea that the ground terminal connector 56 and each FET 53 on the ground side are connected by a straight line or a path as close to a straight line as possible in an allowable range from a viewpoint of the layout of elements on the board 43. Accordingly, it is possible to decrease a difference in length of a current path between the ground terminal connector 56 and the FETs 53 on the ground side of the inverter circuit 52.

The current paths from the power supply terminal connector 65 to the FETs 63 on the power supply side of the inverter circuit 62 in the second system are the same as those in the first system. That is, by providing the current paths between the motor terminals 36B and the power supply branching point BP based on an idea that they are provided to be closer to a straight line, a difference in length of a current path between the motor terminals 36B and the power supply branching point BP for the phase legs of the inverter circuit 62 is decreased. A difference in length between the total current paths from the power supply terminal connector 65 to the motor terminals 36B of the phases is also decreased.

The current paths from the ground terminal connector 66 to the FETs 63 on the ground side of the inverter circuit 62 in the second system are the same as those in the first system. That is, by providing the current paths between the ground terminal connector 66 and the FETs 63 on the ground side of the inverter circuit 62 based on an idea that they are provided to be closer to a straight line, a difference in length of a current path between the ground terminal connector 66 and the FETs 63 on the ground side is decreased.

According to the third embodiment, the same advantages as (1) in the first embodiment can be achieved. Depending on product specifications, the layout according to the third embodiment illustrated in FIG. 10 can be employed as the layout of the board 43.

Fourth Embodiment

A motor control device according to a fourth embodiment will be described below. This embodiment basically has the same configuration as that in the first embodiment illustrated in FIGS. 1 to 4. This embodiment is different from the first embodiment in that two boards 42 and 43 are integrated into a single board.

Figure 12:
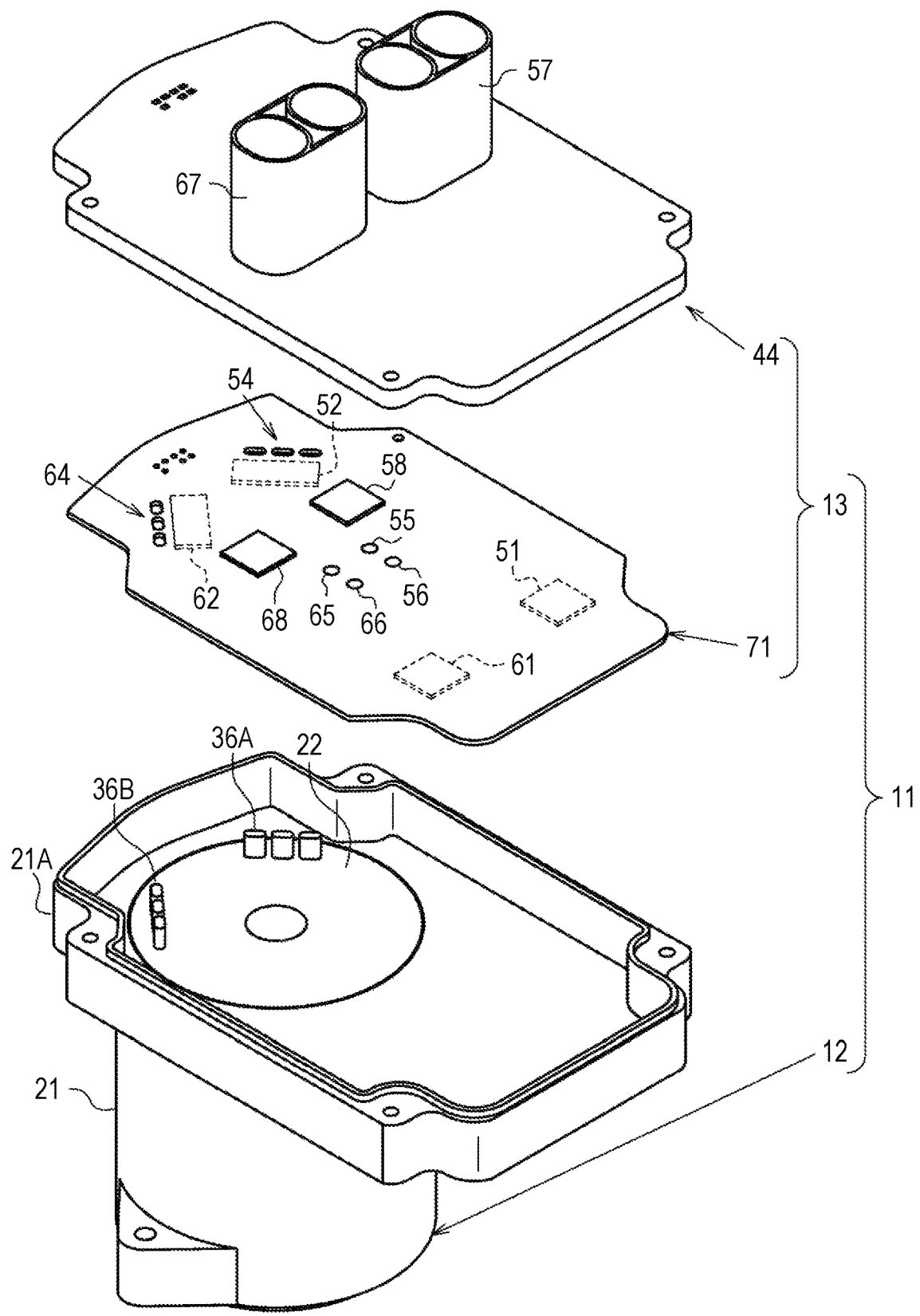
FIG. 12 is an exploded perspective view of a motor control device according to a fourth embodiment.

As illustrated in FIG. 12, a motor system 11 includes a motor 12 and a control device 13. The control device 13 includes a single board 71 and a cover 44. The board 71 has functions of both the two boards 42 and 43 in the first embodiment. The board 71 has the same outer shape as the two boards 42 and 43 when viewed in a direction parallel to an axis O of the motor 12. The board 71 is accommodated in an accommodating section 21A which is provided an end of a case 21 of the motor 12. The accommodating section 21A has a box shape which is open in the axial direction of the motor 12. An inner shape of the accommodating section 21A corresponds to the outer shape of the board 71. A lid 22 and motor terminals 36A and 36B are exposed into the accommodating section 21A. The cover 44 is attached to the accommodating section 21A such that the opening of the accommodating section 21A is covered in a state in which the board 71 is accommodated in the accommodating section 21A.

The motor system 11 includes a motor terminal connector 54, an inverter circuit 52, a filter 58, a power supply terminal connector 55, a ground terminal connector 56, and a microcomputer 51 as elements of a first system. The motor system 11 includes a motor terminal connector 64, an inverter circuit 62, a filter 68, a power supply terminal connector 65, a ground terminal connector 66, and a microcomputer 61 as elements of a second system. For example, an LC filter including an inductor and a capacitor is employed as the filters 58 and 68.

Figure 13:
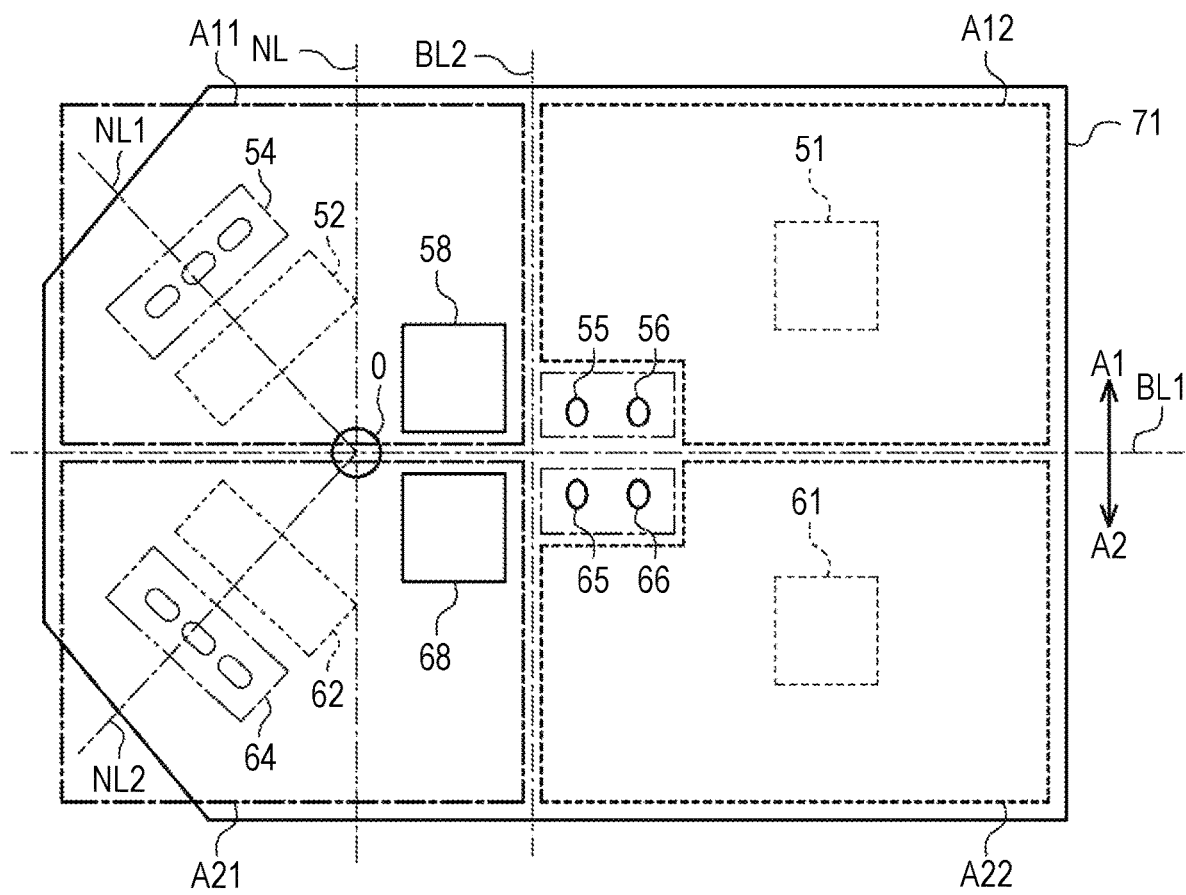
FIG. 13 is a plan view of a board according to the fourth embodiment.

As illustrated in FIG. 13, similarly to the first embodiment, the board 71 is partitioned into a first area A1 and a second area A2 by a boundary line BL1 when viewed in the direction parallel to the axis O of the motor 12. The boundary line BL1 extends along a long side of the board 71. The boundary line BL1 passes through the axis O which is the center of the motor 12 when viewed in the direction parallel to the axis O of the motor 12.

Each of the first area A1 and the second area A2 is additionally partitioned into two areas by a boundary line BL2. That is, the board 71 is partitioned into four areas by the two boundary lines BL1 and BL2 which are perpendicular to each other. The boundary line BL2 extends in a direction perpendicular to the boundary line BL1 when viewed in the direction parallel to the axis O of the motor 12. The boundary line BL2 passes through the vicinity of the center of the board 71 in a direction parallel to the boundary line BL1 when viewed in the direction parallel to the axis O of the motor 12.

The first area A1 is partitioned into a first power circuit area A11 and a first control circuit area A12. The second area A2 is partitioned into a second power circuit area A21 and a second control circuit area A22. The first power circuit area A11 and the second power circuit area A21 correspond to the motor 12 when viewed in the direction parallel to the axis O of the motor 12. The first control circuit area A12 and the second control circuit area A22 are deviated from the motor 12 when viewed in the direction parallel to the axis O of the motor 12.

The inverter circuit 52 and the microcomputer 51 which are elements of the first system are provided on a surface of the board 71 on the motor 12 side. The inverter circuit 52 is provided in the first power circuit area A11 when viewed in the direction parallel to the axis O of the motor 12. Each FET 53 of the inverter circuit 52 is held in a state in which it is in contact with the lid 22 of the case 21 with a thermal grease interposed therebetween. The lid 22 is formed of, for example, a metal material with excellent thermal conductivity such as aluminum. The lid 22 has a function of a bearing holder holding a bearing 39A and a function of a heat sink promoting heat dissipation. The microcomputer 51 is provided in the first control circuit area A12 when viewed in the direction parallel to the axis O of the motor 12.

The inverter circuit 62 and the microcomputer 61 which are elements of the second system are also provided on a surface of the board 71 on the motor 12 side. The inverter circuit 62 is provided in the second power circuit area A21 when viewed in the direction parallel to the axis O of the motor 12. Each FET 63 of the inverter circuit 62 is held in a state in which it is in contact with the lid 22 of the case 21 with a thermal grease interposed therebetween. The microcomputer 61 is provided in the second control circuit area A22 when viewed in the direction parallel to the axis O of the motor 12.

The two filters 58 and 68 are provided on the surface of the board 71 opposite to the motor 12. The filter 58 which is an element of the first system is provided in the first power circuit area A11 when viewed in the direction parallel to the axis O of the motor 12. The filter 68 which is an element of the second system is provided in the second power circuit area A21 when viewed in the direction parallel to the axis O of the motor 12.

Figure 14:
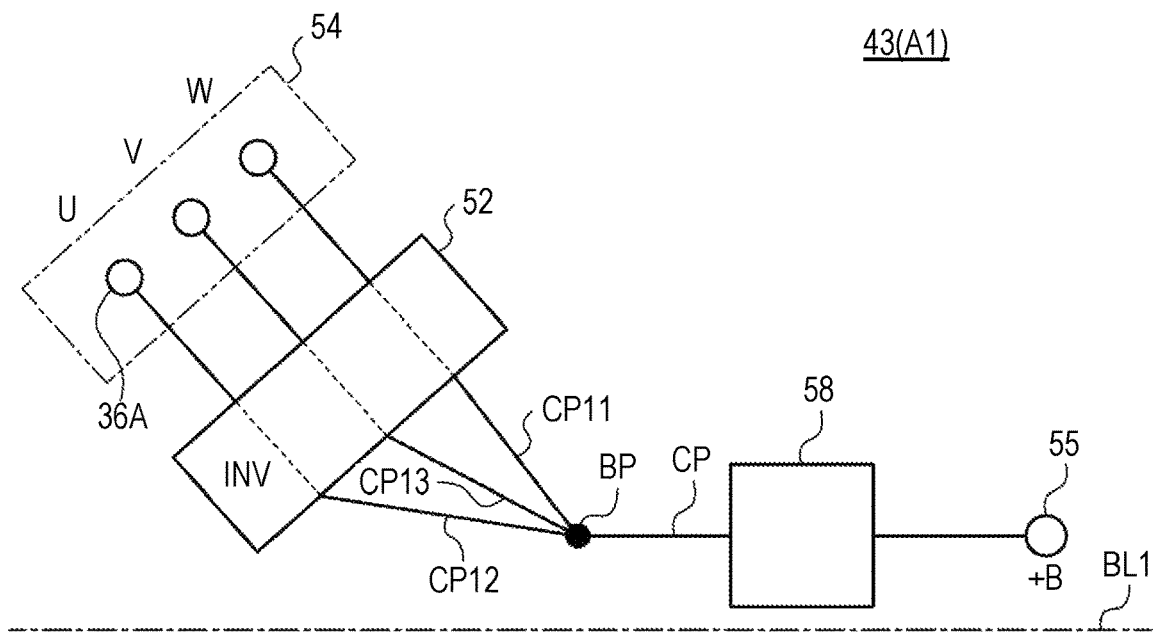
FIG. 14 is a diagram schematically illustrating current paths of three phases from a power supply terminal connector to a motor terminal connector according to the fourth embodiment.

As illustrated in FIG. 14, the filter 58 of the first system is provided in a current path CP between the power supply terminal connector 55 and the inverter circuit 52. More specifically, the filter 58 is located between the power supply terminal connector 55 and a power supply branching point BP in the current path CP. The filter 58 removes noise which is superimposed on DC power supplied from the power supply terminal connector 55 by performing a filtering process on the DC power. Although not illustrated, the filter 68 of the second system is provided in a current path between the power supply terminal connector 65 and the inverter circuit 62. The filter 68 removes noise which is superimposed on DC power supplied from the power supply terminal connector 65 by performing a filtering process on the DC power.

As illustrated in FIG. 13, the power supply terminal connector 55 and the ground terminal connector 56 of the first system are provided in the vicinity of the center of the board 71. The power supply terminal connector 55 and the ground terminal connector 56 are provided at one corner corresponding to the first control circuit area A12 out of four corners which are formed by crossing the two boundary lines BL1 and BL2. The power supply terminal connector 65 and the ground terminal connector 66 of the second system are also provided in the vicinity of the center of the board 71. The power supply terminal connector 65 and the ground terminal connector 66 are provided at one corner corresponding to the second control circuit area A22 out of four corners which are formed by crossing the two boundary lines BL1 and BL2.

The two filters 58 and 68 are also provided in the vicinity of the center of the board 71. The filter 58 of the first system is provided at one corner corresponding to the first power circuit area A11 out of four corners which are formed by crossing the two boundary lines BL1 and BL2. The filter 68 of the second system is provided at one corner corresponding to the second power circuit area A21 out of four corners which are formed by crossing the two boundary lines BL1 and BL2. The two filters 58 and 68 are located at positions which are symmetric with respect to the boundary line BL.

The filter 58 of the first system is provided as close as possible to the power supply terminal connector 55 in an allowable range from a viewpoint of the layout of elements of the board 71 in the direction parallel to the boundary line BL1. The filter 68 of the second system is provided as close as possible to the power supply terminal connector 65 in an allowable range from a viewpoint of the layout of elements of the board 71 in the direction parallel to the boundary line BL1.

Accordingly, according to the fourth embodiment, the following advantages can be achieved in addition to the advantages of (1) and (2) in the first embodiment. (5) The power supply terminal connector 55 and the ground terminal connector 56 of the first system are provided close to the center of the board 71. Accordingly, for example, in comparison with a case in which the power supply terminal connector 55 is provided close to an end of the board 71 opposite to the motor terminal connector 54 in the direction parallel to the boundary line BL1, it is possible to decrease an electrical distance between the power supply terminal connector 55 and the inverter circuit 52 (the FETs 53 on the power supply side). It is also possible to decrease an electrical distance between the ground terminal connector 56 and the inverter circuit 52 (the FETs 53 on the ground side). Accordingly, it is possible to decrease electrical resistance between the power supply terminal connector 55 and the inverter circuit 52 and electrical resistance between the ground terminal connector 56 and the inverter circuit 52. The same as the first system is true of the second system. Accordingly, it is possible to more appropriately supply a current to the motor 12. It is also possible to improve an output power of the motor 12.

(6) The filter 58 of the first system is provided on the board 71. More specifically, the filter 58 is provided in the vicinity of the power supply terminal connector 55 in the current path CP between the power supply terminal connector 55 and the inverter circuit 52. Accordingly, the following advantages can be achieved. That is, for example, it is conceivable that a configuration in which the filter 58 is incorporated into the cover 44 is employed by the motor system 11. In comparison with a case in which this configuration is employed, an electrical distance from the power supply terminal connector 55 to the inverter circuit 52 via the filter 58 is decreased. Accordingly, it is possible to decrease electrical resistance between the power supply terminal connector 55 and the inverter circuit 52. The same as the first system is true of the second system. Accordingly, it is possible to more appropriately supply a current to the motor 12. It is also possible to improve an output power of the motor 12.

(7) The board 71 includes four areas, that is, the first power circuit area A11, the second power circuit area A21, the first control circuit area A12, and the second control circuit area A22. The first power circuit area A11 and the second power circuit area A21 are areas corresponding to the motor 12 when viewed in the direction parallel to the axial direction of the motor 12. Elements of a power system for supplying electric power to the motor 12 such as the inverter circuit (52, 62) and the motor terminal connector (54, 64) are provided in the power circuit area (A11, A21). The control circuit area (A12, A22) is an area deviated from the motor 12 when viewed in the axial direction of the motor 12. Elements of a control system for controlling the operation of the motor 12 such as the microcomputer (51, 61) are provided in the control circuit area (A12, A22).

With this configuration, the elements of the power system can be provided at positions closer to the motor 12. Accordingly, the motor terminal connectors 54 and 64 and the motor terminals 36A and 36B can be more simply connected. It is possible to shorten and simplify the current paths between the inverter circuits 52 and 62 and the motor terminals 36A and 36B. Accordingly, it is possible to more efficiently dispose the elements of the power system and the elements of the control system on the single board 71. Particularly, this configuration is suitable for a board 71 in which circuits of a plurality of systems with a larger number of electronic components are provided.

Figure 15:
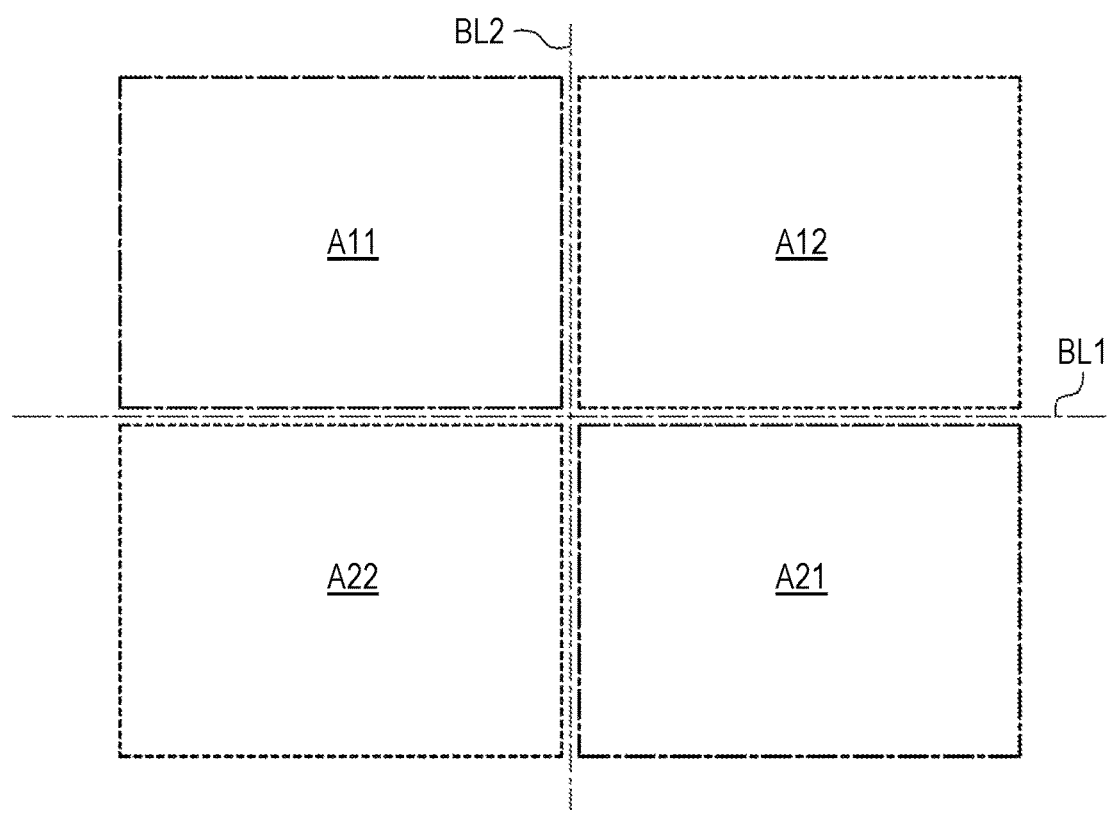
FIG. 15 is a plan view illustrating arrangement of four areas of a board according to a comparative example.

As illustrated in FIG. 15, for example, there is following concern when the positions of the second power circuit area A21 and the second control circuit area A22 are set to positions which are opposite to the positions illustrated in FIG. 13 in the direction parallel to the boundary line BL1. That is, it is difficult to dispose the elements of the power system at positions closer to the motor 12. Accordingly, it is more difficult to connect the motor terminal connector 64 and the motor terminals 36B. The current path between the inverter circuit 62 and the motor terminals 36B may be further elongated and complicated. In addition, there is the same concern when the positions of the first power circuit area A11 and the first control circuit area A12 are set to positions which are opposite to the positions illustrated in FIG. 13 in the direction parallel to the boundary line BL1.

Fifth Embodiment

A motor control device according to a fifth embodiment will be described below. Similarly to the fourth embodiment, this embodiment is different from the first embodiment in that two boards 42 and 43 are integrated as a single board 71. This embodiment basically employs the same configuration as that of the fourth embodiment illustrated in FIG. 12. This embodiment is different from the fourth embodiment in the layout of elements provided on the board 71.

Figure 16:
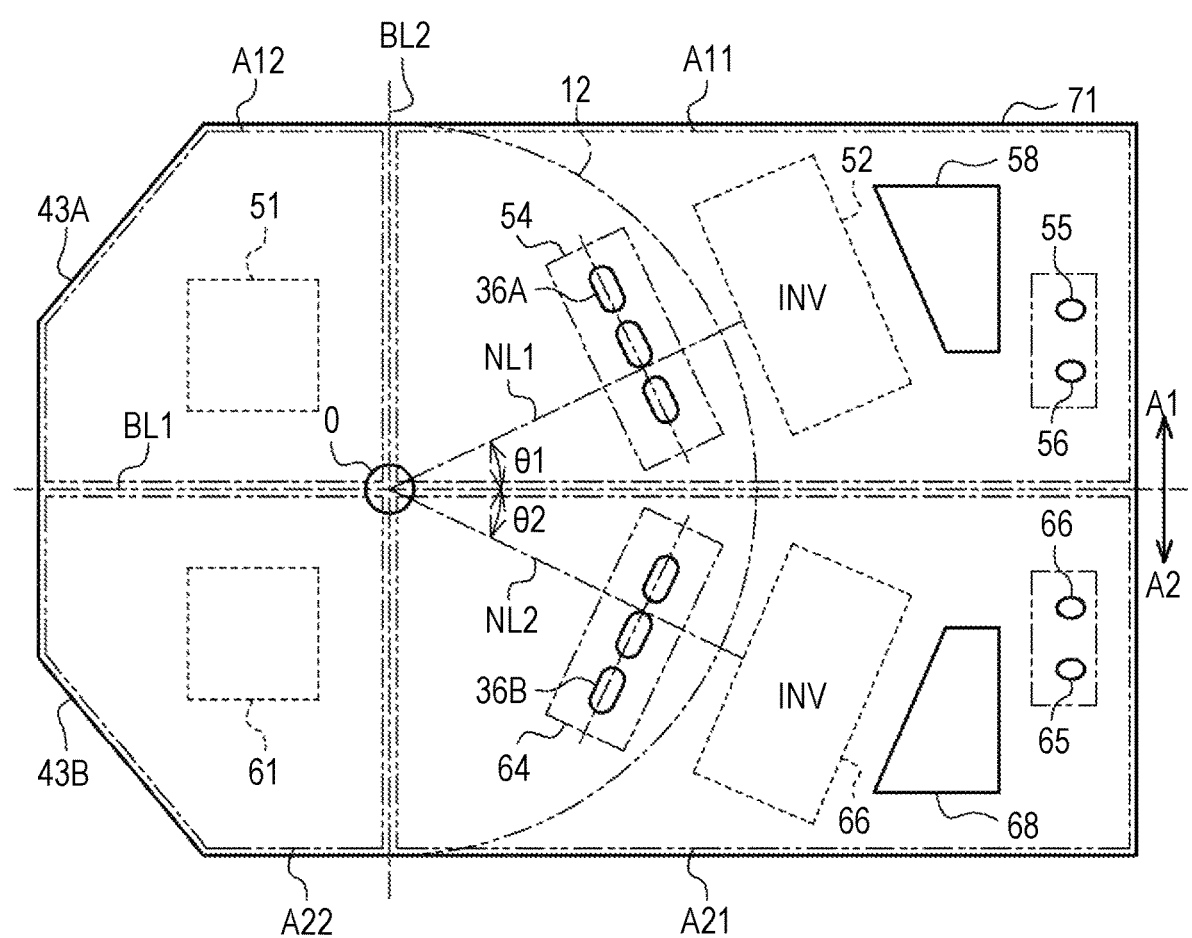
FIG. 16 is a plan view of a board according to a fifth embodiment.

As illustrated in FIG. 16, similarly to the first embodiment, the board 71 is partitioned into a first area A1 and a second area A2 by a boundary line BL1 when viewed in the direction parallel to the axis O of the motor 12. The boundary line BL1 extends along the long side of the board 71 and passes through the axis O of the motor 12. Each of the first area A1 and the second area A2 is additionally partitioned into two areas by a boundary line BL2. That is, the board 71 is partitioned into four areas by the two boundary lines BL1 and BL2 which are perpendicular to each other. The boundary line BL2 is perpendicular to the boundary line BL1 and passes through the axis O of the motor 12 when viewed in the direction parallel to the axis O of the motor 12.

The first area A1 is partitioned into a first power circuit area A11 and a first control circuit area A12. The second area A2 is partitioned into a second power circuit area A21 and a second control circuit area A22. The first power circuit area A11 and the second power circuit area A21 protrude from the motor 12 when viewed in the direction parallel to the axis O of the motor 12. The first control circuit area A12 and the second control circuit area A22 almost overlap the motor 12 when viewed in the direction parallel to the axis O of the motor 12.

As illustrated in FIG. 16, the layout of elements provided on the board 71 is basically the same as that in the third embodiment illustrated in FIGS. 10 and 11 except for the microcomputers 51 and 61. The boundary line BL1 corresponds to the boundary line BL in the third embodiment illustrated in FIG. 10. The boundary line BL2 corresponds to the straight line NL in the third embodiment illustrated in FIG. 10.

The inverter circuit 52 and the microcomputer 51 which are elements of a first system are provided on the surface of the board 71 on the motor 12 side. The inverter circuit 52 is provided in the first power circuit area A11 when viewed in the direction parallel to the axis O of the motor 12. The microcomputer 51 is provided in the first control circuit area A12 when viewed in the direction parallel to the axis O of the motor 12. The filter 58 which is an element of the first system is provided on the surface of the board 71 opposite to the motor 12 side. The filter 58 is provided in the first power circuit area A11 when viewed in the direction parallel to the axis O of the motor 12.

The inverter circuit 62 and the microcomputer 61 which are elements of a second system are also provided on the surface of the board 71 on the motor 12 side. The inverter circuit 62 is provided in the second power circuit area A21 when viewed in the direction parallel to the axis O of the motor 12. The microcomputer 61 is provided in the second control circuit area A22 when viewed in the direction parallel to the axis O of the motor 12. The filter 68 which is an element of the second system is provided on the surface of the board 71 opposite to the motor 12 side. The filter 68 is provided in the second power circuit area A21 when viewed in the direction parallel to the axis O of the motor 12.

Accordingly, according to the fifth embodiment, the same advantages as (1) in the first embodiment can be achieved by laying out the elements other than the microcomputers 51 and 61 of the board 71 in the same way as in the third embodiment illustrated in FIGS. 10 and 11. Depending on product specifications or the like, the layout of the fifth embodiment illustrated in FIG. 16 can be employed as the layout of the board 71.

Other Embodiments

The first to fifth embodiments may be modified as will be described below. The size of the board 42, 43 or 71 may be changed to an appropriate size depending on product specifications. For example, in the first embodiment, the length of the boards 42 and 43 in the direction parallel to the boundary line BL may be set to the same length as the short side of the boards 42 and 43. In this case, the power supply terminal connector 55, the ground terminal connector 56, the power supply terminal connector 65, and the ground terminal connector 66 are provided closer to the axis O of the motor 12 in the direction parallel to the boundary line BL.

A configuration in which two oblique sides 43A and 43B are omitted may be employed as the board 42, 43, or 71. In this case, the board 42, 43, or 71 may have a rectangular shape when viewed in the direction parallel to the axis O of the motor 12. The first end of the board 42, 43, or 71 at which two oblique sides 43A and 43B are provided may be formed in an arc shape centered on the axis of the motor 12 when viewed in the direction parallel to the axis O of the motor 12.

A motor relay may be provided in a current path of each phase between the inverter circuits 52 and 62 and the motor terminal connectors 54 and 64. Turning-on/off of the motor relays is controlled by the microcomputers 51 and 61. The motor relays are maintained in an ON state in a normal state in which no abnormality occurs in the inverter circuits 52 and 62. When an abnormality such as a failure of disconnection or a failure of short-circuit occurs in the inverter circuits 52 and 62, the motor relays are switched from the ON state to the OFF state. When the motor relays are turned off, the current paths between the inverter circuits 52 and 62 and the motor terminal connectors 54 and 64 are cut off and thus supply of electric power from the inverter circuits 52 and 62 to the winding groups of the motor 12 is cut off. In addition, a field effect transistor (FET) may be employed as the motor relay.

In the aforementioned embodiments, the number of connector fitting portions connected to a DC power source such as a battery is the same as the number of systems (two herein), but may be one. For example, when only the connector fitting portion 57 of the first system is provided, a configuration in which the power supply terminal connector 65 and the ground terminal connector 66 of the second system are omitted may be employed as the board 43 or 71. In this case, the power supply terminal connector 55 of the first system is connected to the power supply branching point for the legs (three FETs 63 on the power supply side) of the inverter circuit 62 of the second system via a current path which is provided in a wiring pattern on the board 43 or 71. The ground terminal connector 56 of the first system is connected to the branching point for the legs (three FETs 63 on the ground side) of the inverter circuit 62 of the second system via a current path which is provided in a wiring pattern on the board 43 or 71. When this configuration is employed, the current path between the power supply terminal connector 55 and the motor terminals 36B and the current path between the ground terminal connector 56 and the motor terminals 36B are set based on an idea that they are made to be as close to a straight line as possible in an allowable range from a viewpoint of the layout of elements on the board 43 or 71.

In the aforementioned embodiments, the motor terminal connector 54 and the inverter circuit 52 (three phase legs) of the first system are provided obliquely with respect to the boundary line BL or BL1, and the disclosure is not particularly limited thereto as long as at least the motor terminal connector 54 is inclined with respect to the boundary line BL or BL1. With this configuration, a degree of bending of the current path of each of the three phases extending from the power supply terminal connector 55 to the motor terminals 36A via the inverter circuit 52 can be alleviated by the inclination of the motor terminal connector 54 with respect to the boundary line BL or BL1. That is, the current path of each of the three phases between the power supply terminal connector 55 and the motor terminal connector 54 can be provided to be more linear. Similarly to the first system, at least the motor terminal connector 64 of the motor terminal connector 64 and the inverter circuit 62 of the second system can be inclined with respect to the boundary line BL.

The motor system 11 may be used, for example, as a drive source of an electric power steering system. In this case, the motor 12 serves as an assist motor that generates a steering assist force. The control device 13 controls the motor 12 serving as the assist motor. The motor system 11 may be used as a drive source of a reaction mechanism or a turning mechanism in a steer-by-wire type steering system. In this case, the motor 12 serves as a reaction motor that generates a steering reaction force or a turning motor that generates a turning force for turning the turning wheels of a vehicle. The control device 13 controls the motor 12 serving as the reaction motor or the turning motor. Even when the motor system 11 is applied to any of an electric power steering system and a steer-by-wire type steering system, torque ripples of the motor 12 can be decreased with the motor system 11. Accordingly, it is possible to curb discomfort with torque ripples which are sensed via a steering wheel by a driver.

A device to which the motor system 11 is applied is not limited to an onboard device. The motor system 11 may be applied as a drive source of a machining tool of a machining center or the like.

What is claimed is:

1. A motor control device comprising a board that is provided at an end of a motor including winding groups of two systems and controls supply of electric power to the winding group independently for each system, wherein:
the board includes two areas that are partitioned by a boundary line passing through a center of the motor when viewed in an axial direction of the motor;
a power supply terminal connector that is supplied with DC power from an external DC power supply, an inverter circuit that converts the DC power supplied from the power supply terminal connector to AC power of three phases, and a motor terminal connector that is a group of connection portions to which motor terminals of three phases provided in a line along a circumference of the end of the motor are connected and in which the connection portions of the three phases are disposed at the same positions as the motor terminals of the three phases and that supplies the AC power of three phases supplied from the inverter circuit to the winding group of the corresponding system are provided in each of the two areas as elements corresponding to each system;
the power supply terminal connector, the inverter circuit, and the motor terminal connector are sequentially arranged along the boundary line when viewed in the axial direction of the motor;
the motor terminal connector is provided such that a straight line perpendicular to a direction in which the motor terminals are arranged and the boundary line form an acute angle; and
the power supply terminal connectors, the inverter circuits, and the motor terminal connectors of the two systems provided in the two areas are symmetric with respect to the boundary line when viewed in the axial direction of the motor.

2. The motor control device according to claim 1, wherein the inverter circuit is located inside of the motor terminal connector which is a side approaching the center of the motor with respect to the motor terminal connector when viewed in the axial direction of the motor.

3. The motor control device according to claim 1, wherein the inverter circuit is located outside of the motor terminal connector which is a side away from the center of the motor with respect to the motor terminal connector when viewed in the axial direction of the motor.

4. The motor control device according to claim 1, wherein:
the inverter circuit includes three legs corresponding to the three phases in which a power-supply-side switching element and a ground-side switching element are connected in series;
the three legs are arranged in an extending direction of the motor terminal connector; and
a current path from the power supply terminal connector to the three legs branches into three straight current paths at a power supply branching point for the three legs.

5. The motor control device according to claim 1, wherein the power supply terminal connector is provided close to a center of the board when viewed in the axial direction of the motor.

6. The motor control device according to claim 1, wherein a filter is provided in the current path between the power supply terminal connector and the inverter circuit in the board.

7. The motor control device according to claim 1, wherein a control circuit that controls an operation of the inverter circuit is provided as an element corresponding to each system in the two areas of the board.

8. The motor control device according to claim 7, wherein:
each of the two areas is partitioned into a power circuit area which is an area corresponding to the motor and a control circuit area which is an area outside the motor in a direction parallel to the boundary line when viewed in the axial direction of the motor; and
components of a power system including the motor terminal connector and the inverter circuit are provided in the power circuit area and components of a control system including the control circuit are provided in the control circuit area.

9. A motor control device comprising a board that is provided at an end of a motor including winding groups of two systems and controls supply of electric power to the winding group independently for each system, wherein:
the board includes two areas that are partitioned by a boundary line passing through a center of the motor when viewed in an axial direction of the motor;
in one of the two areas of the board:
a power supply terminal connector that is supplied with DC power from an external DC power supply, an inverter circuit that converts the DC power supplied from the power supply terminal connector to AC power of three phases, and a motor terminal connector that is a group of connection portions to which motor terminals of three phases provided in a line along a circumference of the end of the motor are connected and in which the connection portions of the three phases are disposed at the same positions as the motor terminals of the three phases and that supplies the AC power of three phases supplied from the inverter circuit to the winding group of the corresponding system, are provided as elements corresponding to the respective system; and
the power supply terminal connector, the inverter circuit, and the motor terminal connector are sequentially arranged along the boundary line when viewed in the axial direction of the motor;
in the other of the two areas of the board:
a power supply terminal connector is omitted, and an inverter circuit that converts the DC power supplied from the power supply terminal connector in the one of the two areas to AC power of three phases, and a motor terminal connector that is a group of connection portions to which motor terminals of three phases provided in a line along a circumference of the end of the motor are connected and in which the connection portions of the three phases are disposed at the same positions as the motor terminals of the three phases and that supplies the AC power of three phases supplied from the inverter circuit to the winding group of the corresponding system, are provided as elements corresponding to the respective system;

the inverter circuit and the motor terminal connector in the other of the two areas are sequentially arranged along the boundary line when viewed in the axial direction of the motor; and the power supply terminal connector in the one of the two areas is connected to a power supply branching point for three legs of the inverter circuit in the other of the two areas;

the motor terminal connector in each of the two areas of the board is provided such that a straight line perpendicular to a direction in which the respective motor terminals are arranged and the boundary line form an acute angle; and the inverter circuits and the motor terminal connectors of the two systems provided in the two areas of the board are symmetric with respect to the boundary line when viewed in the axial direction of the motor.

* * * * *